(12) United States Patent
Ouyang et al.

(10) Patent No.: US 7,678,634 B2
(45) Date of Patent: Mar. 16, 2010

(54) LOCAL STRESS ENGINEERING FOR CMOS DEVICES

(75) Inventors: Qiqing Ouyang, Yorktown Heights, NY (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 12/020,916

(22) Filed: Jan. 28, 2008

(65) Prior Publication Data

US 2009/0191679 A1  Jul. 30, 2009

(51) Int. Cl.
*H01L 21/336* (2006.01)
*H01L 21/8234* (2006.01)

(52) U.S. Cl. .............. 438/197; 438/301; 438/700; 257/E21.32; 257/E21.55; 257/E21.218; 257/E21.229; 257/E21.561; 257/E21.633

(58) Field of Classification Search .............. 438/19, 438/300, 301, 311, 505, 672, 706, 712, 745, 438/752, 763, 931
See application file for complete search history.

(56) References Cited

U.S. PATENT DOCUMENTS

| | | | | |
|---|---|---|---|---|
| 6,703,648 B1 * | 3/2004 | Xiang et al. | ................. | 257/192 |
| 6,891,192 B2 | 5/2005 | Chen et al. | | |
| 7,105,395 B2 * | 9/2006 | Burnett et al. | ............... | 438/197 |
| 7,439,110 B2 * | 10/2008 | Cheng et al | ................. | 438/150 |
| 7,538,387 B2 * | 5/2009 | Tsai | ........................ | 257/327 |
| 2004/0256639 A1 | 12/2004 | Ouyang et al. | | |
| 2004/0262694 A1 | 12/2004 | Chidambaram | | |
| 2005/0093076 A1 | 5/2005 | Steegen et al. | | |
| 2005/0148133 A1 | 7/2005 | Chen et al. | | |
| 2005/0156268 A1 | 7/2005 | Chu | | |
| 2005/0167652 A1 | 8/2005 | Hoffmann et al. | | |
| 2005/0205859 A1 | 9/2005 | Currie et al. | | |
| 2008/0283926 A1 * | 11/2008 | Sridhar | ...................... | 257/369 |

FOREIGN PATENT DOCUMENTS

JP          10092947 A        1/2008

OTHER PUBLICATIONS

Ang et al., "Enhanced Performance in 50 nm N-MOSFETs with Silicon-Carbon Source/Drain Regions", Singapore.
Thompson et al., "A 90-nm Logic Technology Featuring Strained-Silicon", IEEE Transactions on Electron Devices, vol. 51, No. 11, Nov. 2004, IEEE.

* cited by examiner

*Primary Examiner*—David Nhu
(74) *Attorney, Agent, or Firm*—Scully, Scott, Murphy & Presser, P.C.; Louis J. Percello, Esq.

(57) ABSTRACT

A first dielectric layer is formed over a PFET gate and an NFET gate, and lithographically patterned to expose a PFET area, while covering an NFET area. Exposed PFET active area is etched and refilled with a SiGe alloy, which applies a uniaxial compressive stress to a PFET channel. A second dielectric layer is formed over the PFET gate and the NFET gate, and lithographically patterned to expose the NFET area, while covering the PFET area. Exposed NFET active area is etched and refilled with a silicon-carbon alloy, which applies a uniaxial tensile stress to an NFET channel. Dopants may be introduced into the SiGe and silicon-carbon regions by in-situ doping or by ion implantation.

20 Claims, 26 Drawing Sheets

LOCAL STRESS ENGINEERING FOR CMOS DEVICES

FIELD OF THE INVENTION

The present invention relates to methods for forming semiconductor devices, and more particularly, to methods for forming semiconductor devices that include an n-type field effect transistor (NFET) having embedded SiC source/drain regions and a p-type field effect transistor having embedded SiGe source/drain regions, wherein the PFET has enhanced hole mobility and the NFET has enhanced electron mobility.

BACKGROUND OF THE INVENTION

Various techniques for enhancing semiconductor device performance through manipulation of carrier mobility have been investigated in the semiconductor industry. One of the key elements in this class of technology is the manipulation of stress in the channel of transistor devices by employing lattice mismatched materials in source/drain regions. Such lattice mismatched materials may be advantageously employed to generate stress on a semiconductor device, for example, by applying biaxial stress or uniaxial stress in a channel of a metal-oxide-semiconductor field effect transistor (MOSFET) to improve performance, for example, by increasing an on-current.

The effect of uniaxial stress, i.e., a stress applied along one crystallographic orientation, on the performance of semiconductor devices, especially on the performance of a MOSFET (or a "FET" in short) device built on a silicon substrate, has been extensively studied in the semiconductor industry. For a p-type MOSFET (or a "PFET" in short) utilizing a silicon channel, the mobility of minority carriers in the channel (which are holes in this case) increases under uniaxial compressive stress along the direction of the channel, i.e., the direction of the movement of holes or the direction connecting the drain to the source. Conversely, for an n-type MOSFET (or an "NFET" in short) devices utilizing a silicon channel, the mobility of minority carriers in the channel (which are electrons in this case) increases under uniaxial tensile stress along the direction of the channel, i.e., the direction of the movement of electrons or the direction connecting the drain to the source. These opposite requirements for the type of stress for enhancing carrier mobility between the PFETs and NFETs have led to prior art methods for applying at least two different types of stress to the semiconductor devices on the same integrated chip.

Thompson et al., "A 90-nm Logic Technology Featuring Strained-Silicon," IEEE Transactions on Electron Devices, Vol. 51, No. 11, pp. 1790-1797, November (2004) discloses a p-type filed effect transistor (PFET) employing embedded SiGe in source/drain (S/D) regions, which provide a compressive uniaxial stress along a channel between the embedded SiGe source/drain regions. The compressive uniaxial stress along the channel enhances mobility of holes, and as a consequence, increases the on-current of the PFET.

Ang et al., "Enhanced Performance in 50 nm N-MOSFETs with Silicon-Carbon Source/Drain Regions," IEDM Technical Digest 2004, pp. 1069-1071, Digital Object Identifier: 10.1109/IEDM.2004.1419383, discloses an n-type filed effect transistor (NFET) employing embedded silicon-carbon (Si:C) in source/drain (S/D) regions, which provide a tensile uniaxial stress along a channel between the embedded silicon-carbon source/drain regions. The tensile uniaxial stress along the channel enhances mobility of electrons, and as a consequence, increases the on-current of the NFET.

In order to utilize the benefits of enhanced on-current from a PFET and an NFET, SiGe source/drain regions and silicon-carbon source/drain regions need to be formed on the same semiconductor substrate. However, the integration of both SiGe source/drain regions and silicon-carbon source/drain regions is challenging since SiGe source/drain regions need to be formed only for PFETs and silicon-carbon source/drain regions need to be formed only for NFETs.

In view of the above there exists a need for methods for forming hole mobility enhanced PFETs and electron mobility enhanced NFETs on the same semiconductor substrate.

Particularly, there exists a need for methods, i.e., an integration scheme, for forming SiGe source/drain regions and silicon-carbon source drain regions on the same semiconductor substrate.

SUMMARY OF THE INVENTION

To address the needs described above, the present invention provides methods for forming SiGe source/drain regions and silicon-carbon source/drain regions on the same semiconductor substrate.

In the present invention, a first dielectric layer is formed over a PFET gate and an NFET gate, and lithographically patterned to expose a PFET area, while covering an NFET area. Exposed PFET active area is etched and refilled with a SiGe alloy, which applies a uniaxial compressive stress to a PFET channel. A second dielectric layer is formed over the PFET gate and the NFET gate, and lithographically patterned to expose the NFET area, while covering the PFET area. Exposed NFET active area is etched and refilled with a silicon-carbon alloy, which applies a uniaxial tensile stress to an NFET channel. Dopants may be introduced into the SiGe and silicon-carbon regions by in-situ doping or by ion implantation.

According to the present invention, a method of forming a semiconductor structure is provided, which comprises:

forming and patterning a first dielectric layer on a semiconductor substrate, wherein a first device region containing a first gate stack is exposed, while a second device region containing a second gate stack is masked by the first dielectric layer;

forming embedded SiGe regions in the first device region by a first selective epitaxy;

forming and patterning a second dielectric layer on the embedded SiGe regions, wherein the area containing the second gate stack is exposed, while the first device region containing the first gate stack is masked by the second dielectric layer; and forming embedded silicon-carbon regions in the second device region by a second selective epitaxy.

In one embodiment, the method further comprises forming first source/drain trenches in the first device region by etching silicon from exposed surfaces of the first device region, while the first dielectric layer protects the second device region, wherein the embedded SiGe regions are subsequently formed in the first source/drain trenches.

In another embodiment, the method further comprises forming a first gate spacer on the first gate stack, wherein edges of the first source/drain trenches are substantially coincident with sidewalls of the first gate spacer.

In even another embodiment, the method further comprises forming first source/drain extension regions having a p-type doping in the first device region prior to the forming of the first source/drain trenches, wherein the first source/drain extension regions are self-aligned to the first gate spacer.

In yet another embodiment, the embedded SiGe regions are substantially undoped or n-doped.

In still another embodiment, the method further comprises implanting p-type dopants into upper portions of the embedded SiGe regions to form embedded SiGe source/drain regions.

In still yet another embodiment, portions of the embedded SiGe regions are substantially free of the p-type dopants and constitute embedded SiGe body regions.

The embedded SiGe regions may be doped in-situ with p-type dopants during the first selective epitaxy.

The embedded SiGe regions may comprise Ge from about 15% to about 35% in atomic concentration.

In a further embodiment, the method further comprises forming second source/drain trenches in the second device region by etching silicon from exposed surfaces of the second device region, while the second dielectric layer protects the first device region, wherein the embedded silicon-carbon regions are subsequently formed in the second source/drain trenches.

In an even further embodiment, the method further comprises forming a second gate spacer on the second gate stack, wherein edges of the second source/drain trenches are substantially coincident with sidewalls of the second gate spacer.

In a yet further embodiment, the method further comprises forming second source/drain extension regions having a n-type doping in the second device region prior to the forming of the second source/drain trenches, wherein the second source/drain extension regions are self-aligned to the second gate spacer.

In a still further embodiment, the embedded silicon-carbon regions are substantially undoped or p-doped.

In a still yet further embodiment, the method further comprises implanting n-type dopants into upper portions of the embedded silicon-carbon regions to form embedded silicon-carbon source/drain regions.

In further another embodiment, portions of the embedded silicon-carbon regions are substantially free of the n-type dopants and constitute embedded silicon-carbon body regions.

In an even further another embodiment, the embedded silicon-carbon regions are doped in-situ with n-type dopants during the second selective epitaxy.

In a yet further another embodiment, the embedded silicon-carbon regions comprise C from about 0.5% to about 4.0% in atomic concentration.

In a still further another embodiment, the first dielectric layer and the second dielectric layer comprise silicon nitride.

In a still yet further another embodiment, the method further comprises forming an etch-stop dielectric layer comprising silicon oxide directly on the embedded SiGe regions, wherein the second dielectric layer is formed directly on the etch-stop dielectric layer.

The method may further comprise:

forming a silicon oxide layer directly on the first gate stack and the second gate stack;

forming a first spacer on the silicon oxide layer in the first device region and a second spacer on the silicon oxide layer in the second device region, wherein the first and second spacers comprise silicon nitride; and forming a first silicon nitride cap on the first gate stack and a second silicon nitride cap on the second gate stack, wherein the first dielectric layer is formed on the first and second nitride caps and the first and second spacers.

DETAILED DESCRIPTION OF THE INVENTION

Figure 1:
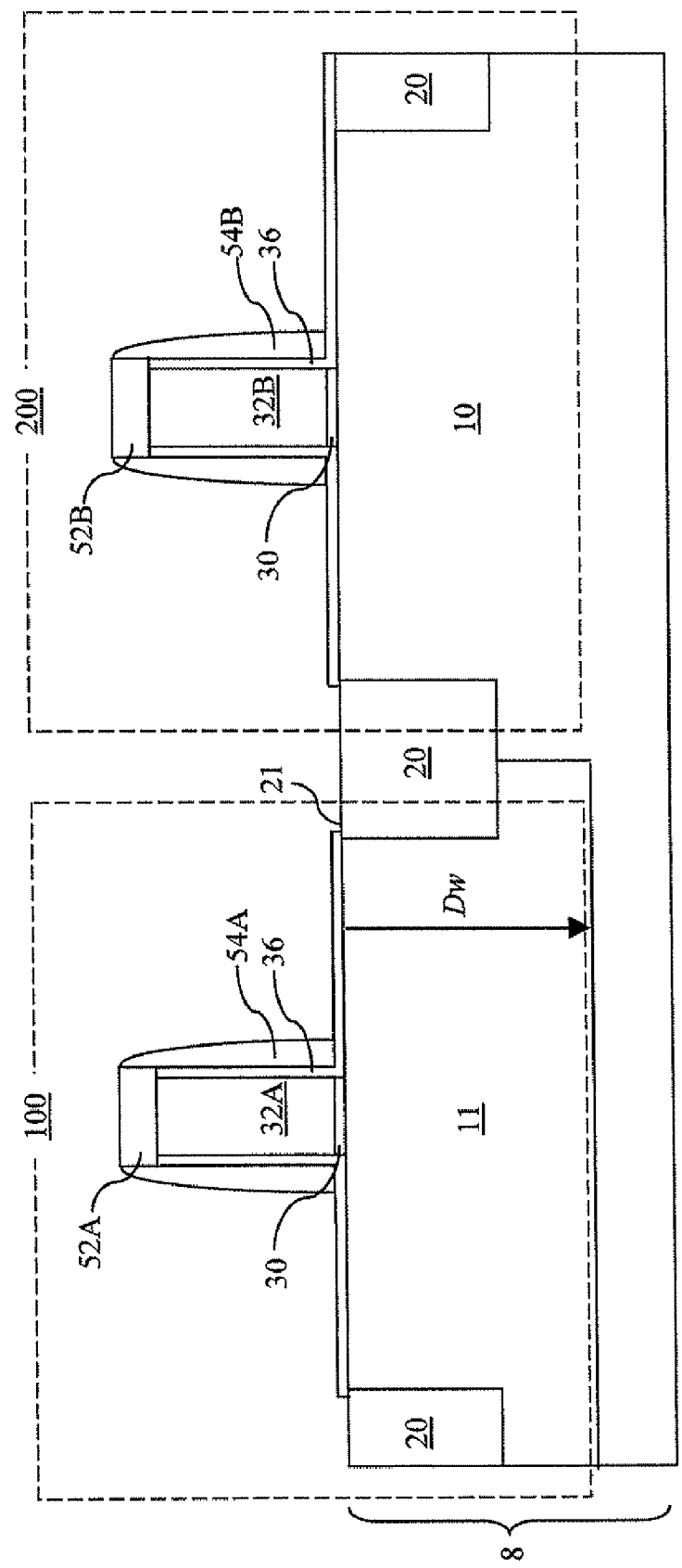
FIGS. 1-13 are sequential vertical cross-sectional views of a first exemplary semiconductor structure according to a first embodiment of the present invention.

As stated above, the present invention relates to methods for forming semiconductor devices that include an n-type field effect transistor (NFET) having embedded SiC source/drain regions and a p-type field effect transistor having embedded SiGe source/drain regions, which are now described in detail with accompanying figures. It is noted that like and corresponding elements are referred to by like reference numerals.

Referring to FIG. 1, a first exemplary semiconductor structure according to a first embodiment of the present invention is shown, which comprises a semiconductor substrate 8 containing a first semiconductor region 10 and a shallow trench isolation structure 20. The first semiconductor region 10 comprises a semiconductor material having a doping of a first conductivity type at a first dopant concentration. The semiconductor substrate 8 further contains a second semiconductor region 11 comprising the semiconductor material and having a doping of a second conductivity type, wherein the second conductivity type is the opposite of the first conductivity type. The first semiconductor region 10 may have a p-type doping and the second semiconductor region 11 may have an n-type doping, or vice versa. For the purposes of describing the present invention, the semiconductor material is silicon, the first semiconductor region 10 has a p-type doping, and the second semiconductor region 11 has an n-type doping. Typically, the second semiconductor region 11 comprises a well extending from a top surface 21 of the semiconductor substrate 8 to a well depth Dw into the semiconductor substrate 8. Preferably, the first and second semiconductor regions (10, 11) are single crystalline, i.e., have the same crystallographic orientations throughout the volume of the semiconductor substrate 8.

The semiconductor substrate 8 may be a bulk substrate, a semiconductor-on-insulator (SOI) substrate, a silicon-germanium-on-insulator (SGOI) substrate, a hybrid substrate having a bulk portion and an SOI portion, or a strained-silicon-directly-on-insulator (SSDOI) substrate. While the present invention is described with a bulk substrate, embodiments employing an SOI substrate, an SGOI substrate, a hybrid substrate, or a SSDOI substrate are explicitly contemplated herein.

The first semiconductor region 10 and the second semiconductor region 11 are typically lightly doped, i.e., have a dopant concentration from about $1.0 \times 10^{15}/cm^3$ to about $3.0 \times 10^{18}/cm^3$, and preferably from about $1.0 \times 10^{15}/cm^3$ to about $3.0 \times 10^{17}/cm^3$, although lesser and greater dopant concentrations are explicitly contemplated herein.

The first exemplary semiconductor structure comprises a first device region 100 and a second device region 200, each formed on and containing a portion of the semiconductor substrate 8. The first device region 100 may comprise a metal-oxide-semiconductor field effect transistor (MOSFET) of one conductivity type, and the second device region 200 may comprise a MOSFET of the opposite conductivity type. For the purposes of description of the present invention, the first device region 100 comprises a p-type field effect transistor (PFET), and the second device region 200 may comprise an n-type field effect transistor (NFET).

The first device region 100 comprises a portion of the second semiconductor region 11 and a first gate electrode formed thereupon. Likewise, the second device region 200 comprises a portion of the first semiconductor region 10 and a second gate electrode formed thereupon. Each of the first gate electrode and the second gate electrode comprises a gate dielectric 30 and a gate conductor (32A or 32B), and may be formed by methods well known in the art. The gate dielectric 30 may comprise a conventional silicon oxide based gate dielectric material or a high-k gate dielectric material known in the art. The gate conductor in the first device region 100 is herein referred to as a first gate conductor 32A and the gate conductor in the second device region 200 is herein referred to as a second gate conductor 32B. The gate conductors (32A, 32B) may comprise a doped semiconductor material such as doped polysilicon or a doped polycrystalline silicon alloy, or may comprise a metal gate material known in the art.

Silicon nitride caps are formed on top of the first gate electrode and the second gate electrode. The silicon nitride cap in the first device region 100 is herein referred to as a first silicon nitride cap 52A and the silicon nitride cap in the second device region 200 is herein referred to as a second silicon nitride cap 52B. In case the gate conductor 32 comprises silicon, a silicon oxide layer 36 may optionally be formed by thermal oxidation of exposed surfaces of the first and second semiconductor regions (10, 11) and the sidewalls of the gate conductors 32. The silicon oxide layer 36 may be subsequently employed as an etch-stop dielectric layer.

A first dummy gate spacer 54A is formed on the sidewalls of the first gate conductor 32A, or on the sidewalls of the silicon oxide layer 36, if present, in the first device region 100. A second dummy gate spacer 54B is formed on the sidewalls of the second gate conductor 32B, or on the sidewalls of the silicon oxide layer 36, if present, in the second device region 200. Preferably, the first and second dummy gate spacers (54A, 54B) comprise silicon nitride. The thickness of the first and second dummy gate spacers (54A, 54B) may be adjusted to optimize the offset distance of source/drain extension regions to be subsequently formed from the sidewalls of the first gate electrode and the second gate electrode. The first and second dummy gate spacers (54A, 54B) have a thickness from about 3 nm to about 30 nm, and typically from about 5 nm to about 20 nm, although lesser and greater thicknesses are contemplated herein also.

Figure 2:
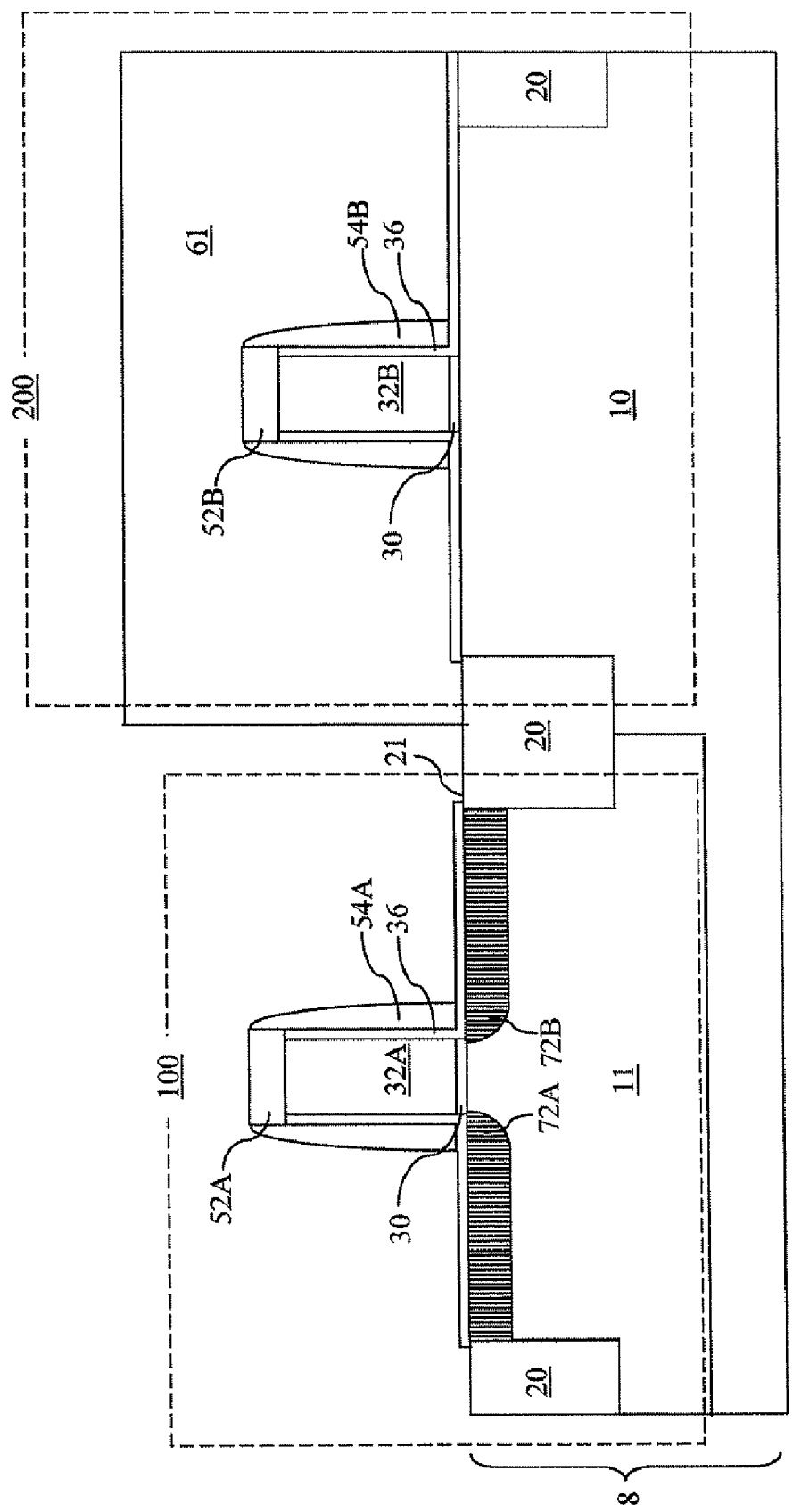

Referring to FIG. 2, a masked ion implantation is performed into the second semiconductor region 11 employing a first photoresist 61 to form first silicon-containing source/drain extension regions (72A, 72B). Specifically, the first photoresist 61 is applied on the semiconductor substrate 8 and lithographically patterned with a first block mask such that the first device region 100 is exposed and the second device region 200 is covered by the first photoresist 61. A first silicon-containing source extension region 72A and a first silicon-containing drain extension region 72B are formed in the first device region 100 by ion implantation of p-type dopants such as B, Ga, In, or a combination thereof. The dopant concentration of the first silicon-containing source/drain extension regions (72A, 72B) may be from about $3.0 \times 10^{18}/cm^3$ to about $3.0 \times 10^{21}/cm^3$, and typically from about $3.0 \times 10^{19}/cm^3$ to about $3.0 \times 10^{20}/cm^3$, although lesser and greater dopant concentrations are herein contemplated also. Halo regions (not shown) may be formed in the second semiconductor region 11 directly beneath the first silicon-containing source/drain extension regions (72A, 72B). After ion implantation, the first photoresist 61 is typically removed utilizing a conventional resist removal process.

Figure 3:
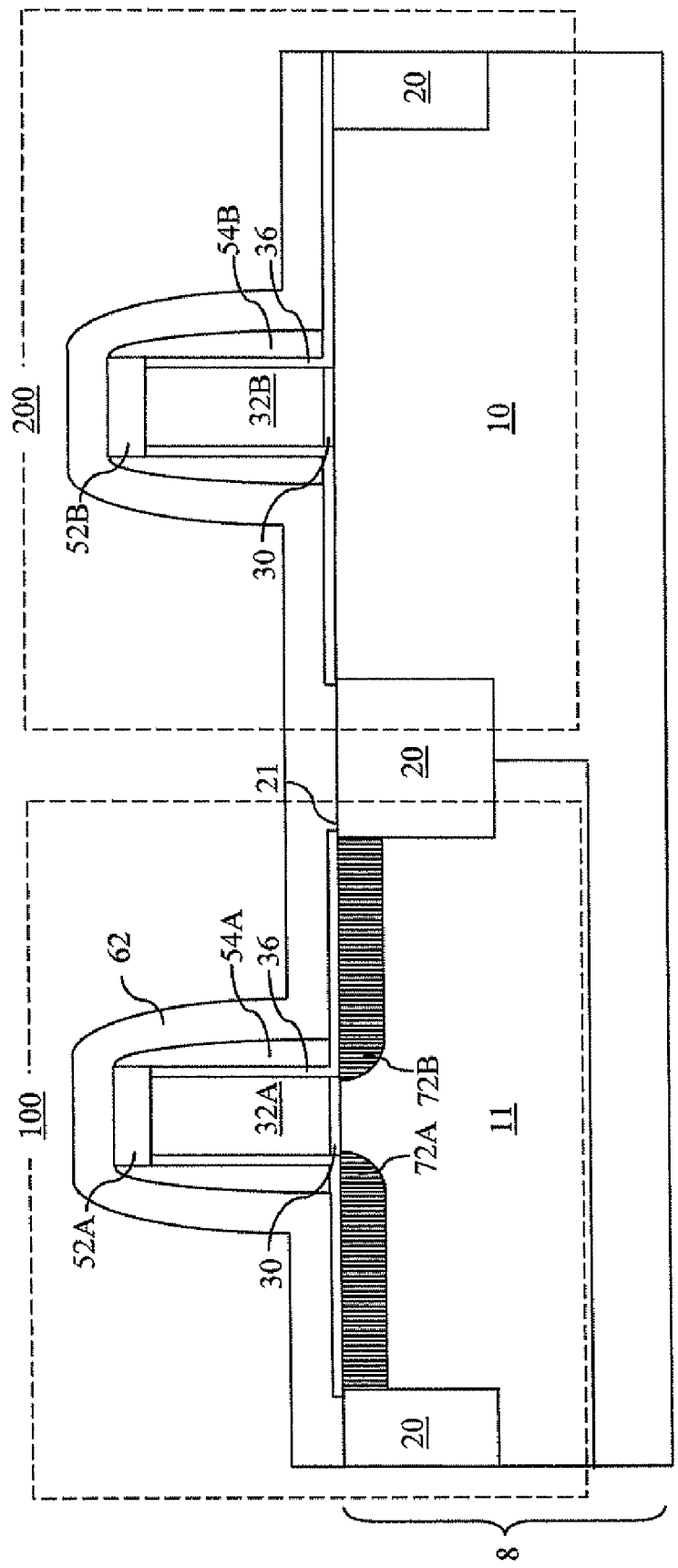

Referring to FIG. 3, a first dielectric layer 62 is formed on the first and second dummy gate spacers (54A, 54B) and first and second gate nitride caps (52A, 52B). The first dielectric layer 62 comprises a dielectric nitride or dielectric oxide. For example, the first dielectric layer 62 may comprise silicon nitride. The first dielectric layer 62 may be formed by plasma enhanced chemical vapor deposition (PECVD), low pressure chemical vapor deposition (LPCVD), rapid thermal chemical vapor deposition (RTCVD), high density plasma chemical vapor deposition (HDPCVD), or other known deposition techniques. The thickness of the first dielectric layer 62 may be from about 20 nm to about 100 nm, although lesser and greater thicknesses are also contemplated herein.

Figure 4:
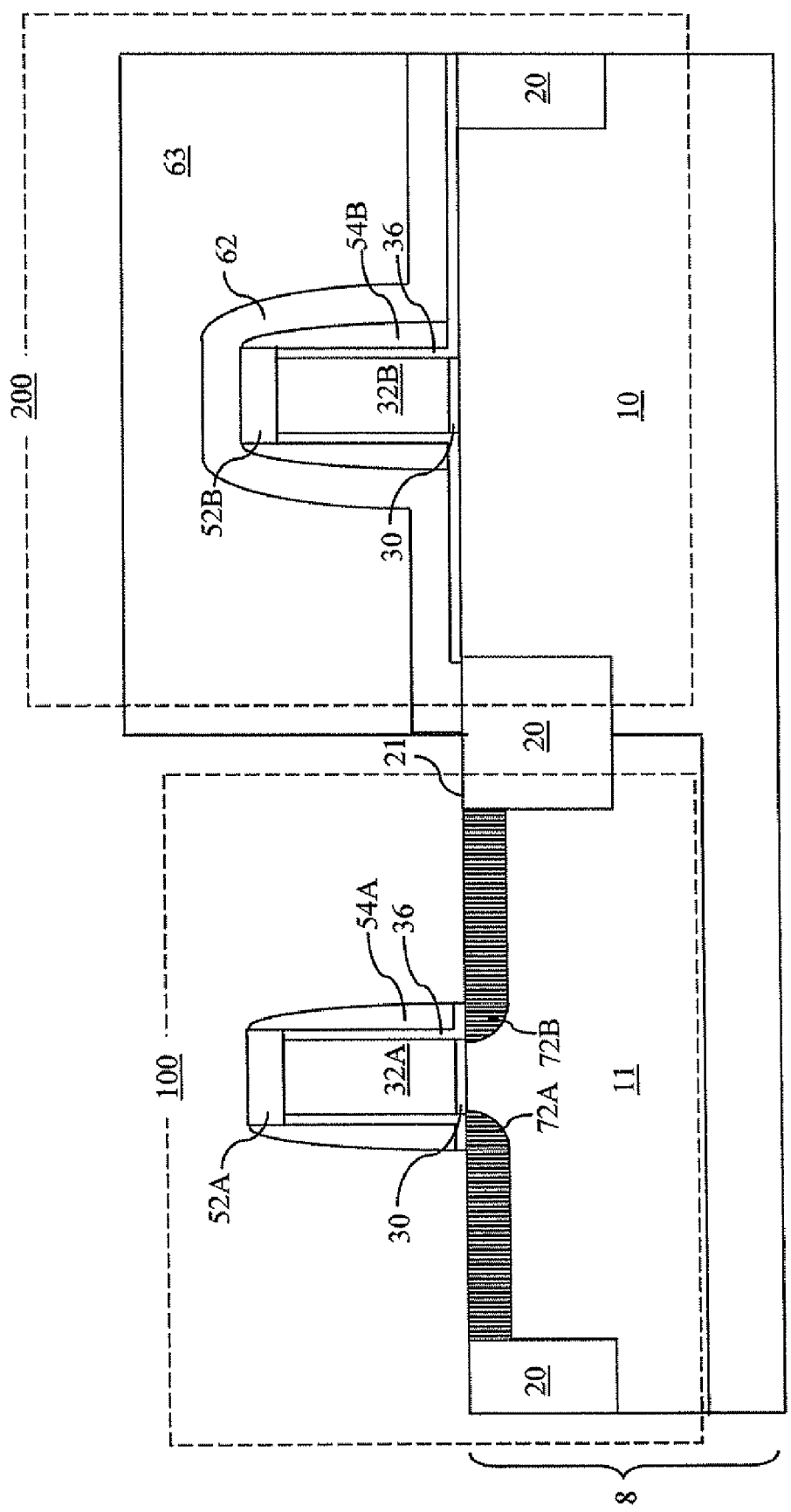

Referring to FIG. 4, a second photoresist 63 is applied to the first dielectric layer 62 and lithographically patterned to cover the second device region 200, while exposing the first device region 100. The portion of the first dielectric layer 62 in the first device region 100 is removed by an etch, which may be a dry etch or a wet etch. The exposed portion of the silicon oxide layer 36, if present is removed. The first silicon-containing source/drain extension regions (72A, 72B) are exposed. The second photoresist 63 may be removed at this step, or alternately, may be removed after the formation of first source/drain trenches to be subsequently formed at the next step.

Figure 5:
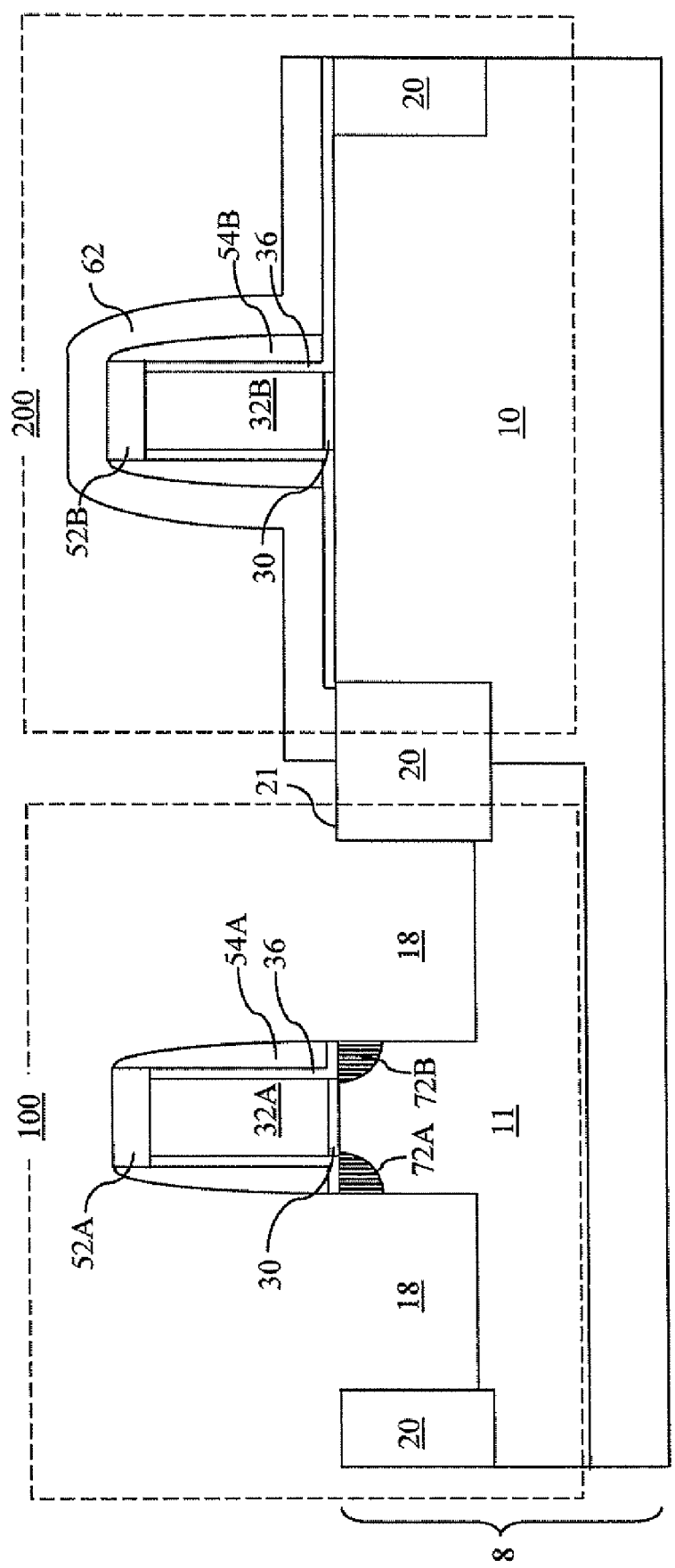

Referring to FIG. 5, first source/drain trenches 18 are formed by removing portions of the second semiconductor region 11 within the first device region 100 by an anisotropic etch such as a reactive ion etch. The first source/drain trenches 18 include a first source side trench formed on one side of the first gate electrode and a first drain side trench formed on the other side of the first gate electrode. Preferably, the reactive ion etch is selective to the first dielectric layer 62, the first gate nitride cap 52A, the first dummy gate spacer 54A, and the shallow trench isolation structure 20. Some edges of the first source/drain trenches 18 are substantially self-aligned to the outer sidewalls of the first dummy gate spacer 54A. Other edges of the first source/drain trenches 18 may be self-aligned to the edges of the shallow trench isolation structures 20. Preferably, the depth of the first source/drain trenches 18 is less than the depth of the shallow trench isolation structure 20. In case the semiconductor substrate 8 is an SOI substrate, the depth of the first source/drain trenches 18 is less than the thickness of a top semiconductor layer, i.e., a buried insulator layer is not exposed at the bottom of the first source/drain trenches. Presence of the second semiconductor region 11 at the bottom of the first source/drain trenches 18 enables epitaxial alignment of a SiGe alloy to be subsequently formed within the first source/drain trenches 18 to the lattice structure of the second semiconductor region 11. The depth of the first source/drain trenches 18 may be from about 10 nm to about 150 nm, and typically from about 20 nm to about 100 nm, although lesser and greater depths are contemplated herein also. The second photoresist 63 is subsequently removed.

Figure 6:
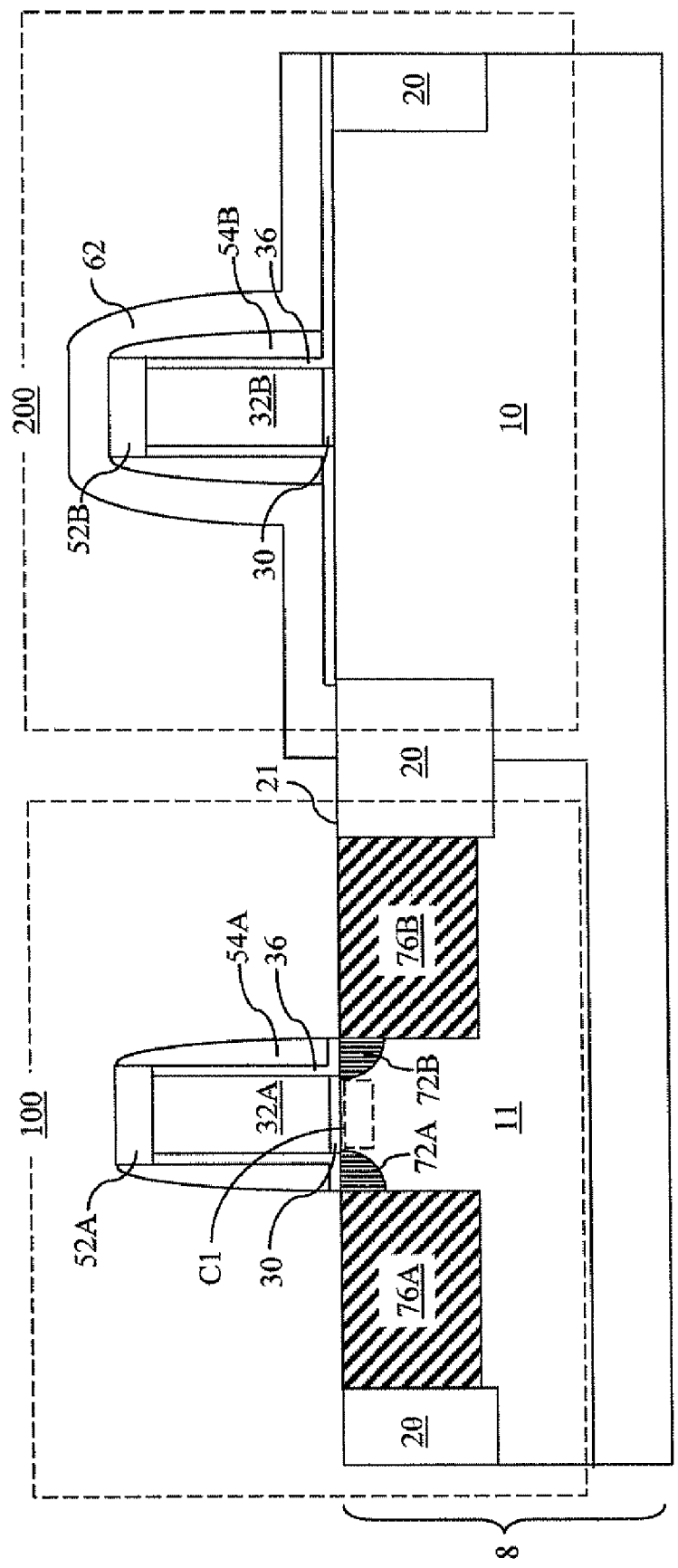

Referring to FIG. 6, embedded SiGe regions are formed by in-situ doped selective epitaxy within the first source/drain trenches 18. The embedded SiGe regions comprise single crystalline SiGe alloy portions, and include an embedded SiGe source region 76A and an embedded SiGe drain region 76B, which are herein collectively termed "embedded source/drain SiGe regions" (76A, 76B). The embedded SiGe source/drain regions (76A, 76B) comprise a silicon germanium alloy having a p-type doping. Preferably, the embedded SiGe source/drain regions (76A, 76B) comprise germanium from about 15% to about 35% in atomic concentration, although lesser and greater concentration are explicitly contemplated herein also. The embedded SiGe source/drain regions (76A, 76B) comprise a p-type dopant, e.g., B, Ga, In, or a combination thereof, at a concentration from about $3.0 \times 10^{19}/cm^3$ to about $3.0 \times 10^{21}/cm^3$, and typically from about $1.0 \times 10^{20}/cm^3$ to about $1.0 \times 10^{21}/cm^3$, although lesser and greater concentrations are also contemplated herein.

The embedded SiGe source/drain regions (76A, 76B) are epitaxially aligned to the second semiconductor region 11. Due to the forced epitaxial alignment of the embedded SiGe source/drain regions (76A, 76B) to the second semiconductor region 1, the embedded SiGe source/drain regions (76A, 76B) apply a compressive uniaxial stress to a first channel C1 directly underneath the gate dielectric 30 in the first device region 100.

Figure 7:
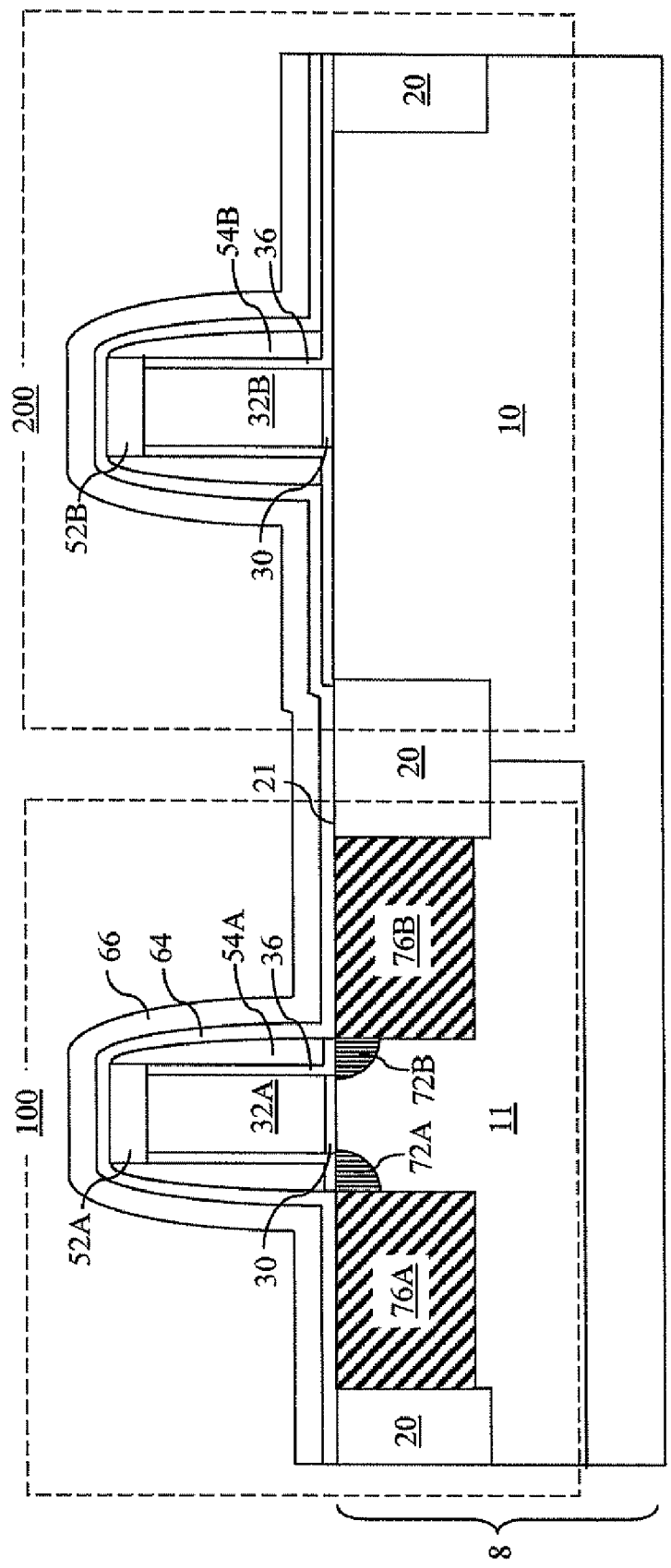

Referring to FIG. 7, an etch-stop dielectric layer 64 and a second dielectric layer 66 are formed on the embedded SiGe source/drain regions (76A, 76B) and the first and second dummy gate spacers (54A, 54B). The second dielectric layer 66 comprises a dielectric oxide or a dielectric nitride. For example, the second dielectric layer 66 may comprise silicon nitride. The etch-stop dielectric layer 64 comprises a dielectric material that is different from the material of the second dielectric layer 66. If the second dielectric layer 66 comprises silicon nitride, the etch-stop dielectric layer 64 may comprise silicon oxide. The thickness of the second dielectric layer 66 may be from about 20 nm to about 100 nm, although lesser and greater thicknesses are also contemplated herein. The thickness of the etch-stop dielectric layer 64 may be from about 5 nm to about 30 nm, although lesser and greater thicknesses are also contemplated herein.

Figure 8:
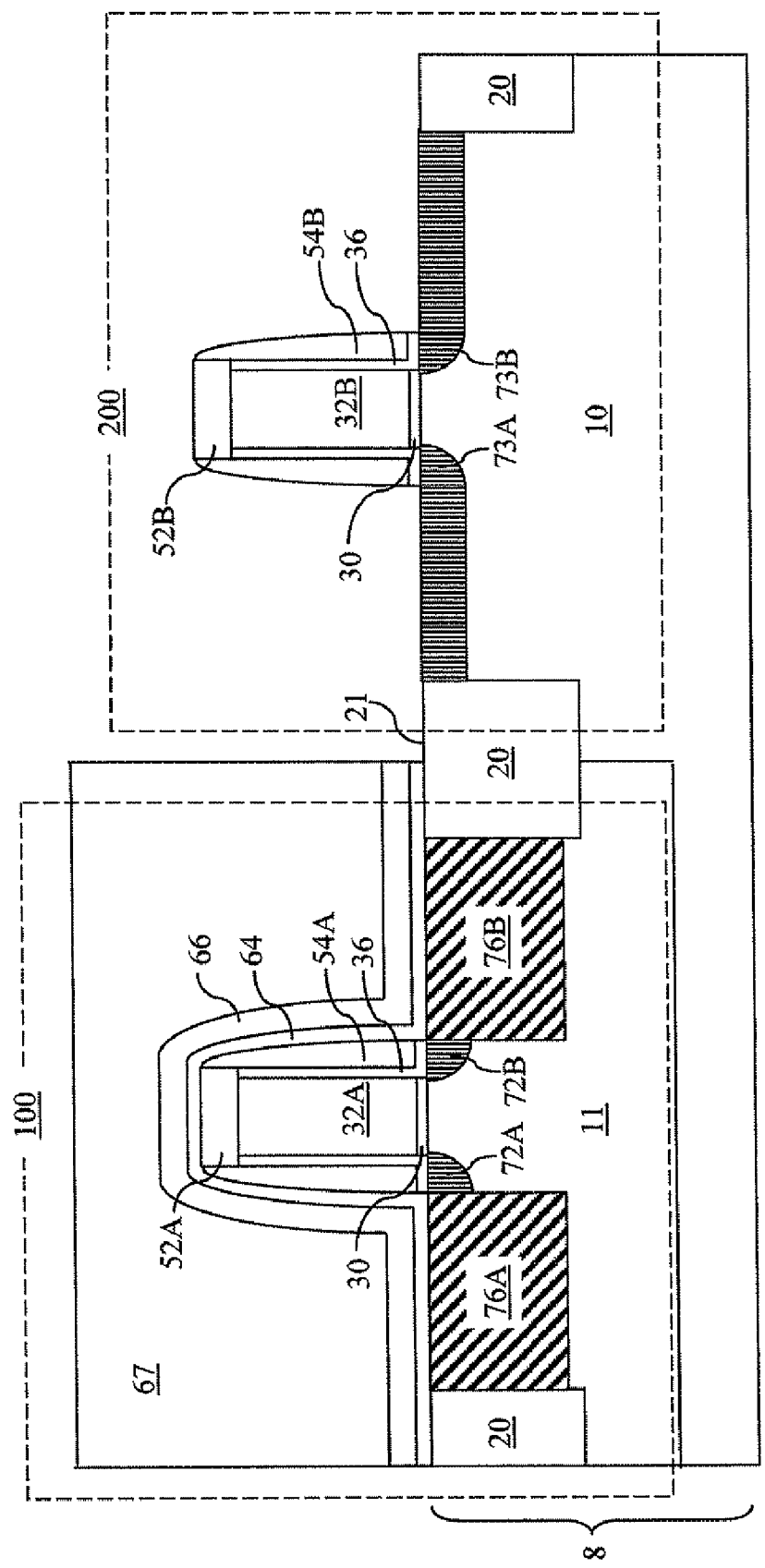

Referring to FIG. 8, a third photoresist 67 is applied over the second dielectric layer 66 and lithographically patterned to expose the second device region 200, while blocking the first device region 100. The exposed portions of the second dielectric layer 66 in the second device region 200 is removed by a first etch, which may be a wet etch or a dry etch employing the third photoresist 67 as an etch mask. Preferably, the first etch is selective to the etch-stop dielectric layer 64. Exposed portions of the etch-stop dielectric layer 64 in the second device region 200 are removed by a second etch employing the third photoresist 67 as an etch mask. Preferably, the second etch is selective to the second dummy gate spacer 54B, the second gate cap nitride 52B, and the first semiconductor region 10.

A masked ion implantation is performed into the first semiconductor region 10 employing the third photoresist 67 as a blocking mask to form second silicon-containing source/drain extension regions (73A, 73B). A second silicon-containing source extension region 73A and a second silicon-containing drain extension region 73B are formed in the second device region 200 by ion implantation of n-type dopants such as P, As, Sb, or a combination thereof. The dopant concentration of the second silicon-containing source/drain extension regions (73A, 73B) may be from about $3.0 \times 10^{18}/cm^3$ to about $3.0 \times 10^{21}/cm^3$, and typically from about $3.0 \times 10^{19}/cm^3$ to about $3.0 \times 10^{20}/cm^3$, although lesser and greater dopant concentrations are herein contemplated also. Halo regions (not shown) may be formed in the first semiconductor region directly 10 beneath the second silicon-containing source/drain extension regions (73A, 73B). The third photoresist 67 may be removed at this point, or alternately, may be removed after the formation of second source/drain trenches to be subsequently formed at the next step.

Figure 9:
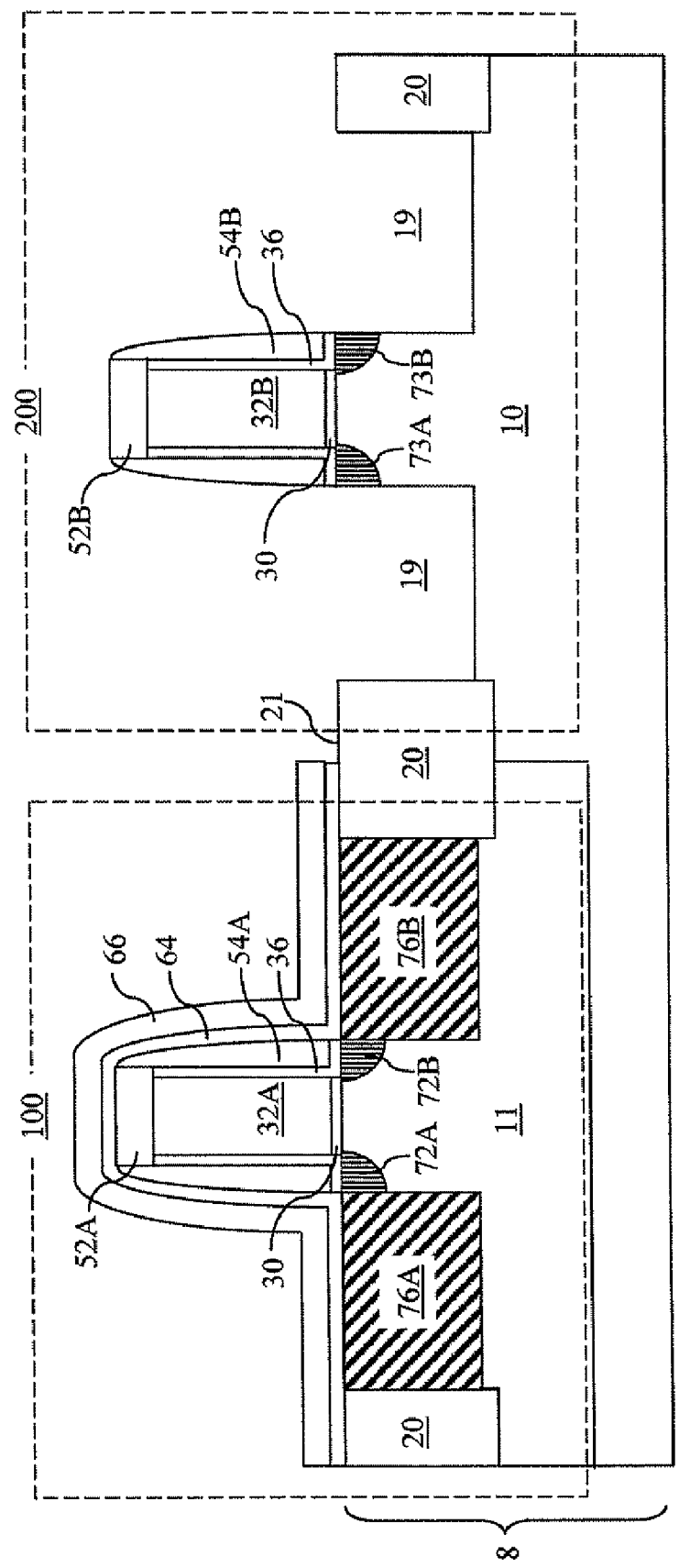

Referring to FIG. 9, second source/drain trenches 19 are formed by removing portions of the first semiconductor region 10 within the second device region 200 by an anisotropic etch such as a reactive ion etch. The second source/drain trenches 19 include a second source side trench formed on one side of the second gate electrode and a second drain side trench formed on the other side of the second gate electrode. Preferably, the reactive ion etch is selective to the second dielectric layer 66, the second gate nitride cap 52B, the second dummy gate spacer 54B, and the shallow trench isolation structure 20. Some edges of the second source/drain trenches 19 are substantially self-aligned to the outer sidewalls of the second dummy gate spacer 54B. Other edges of the second source/drain trenches 19 may be self-aligned to the edges of the shallow trench isolation structures 20. Preferably, the depth of the second source/drain trenches 19 is less than the depth of the shallow trench isolation structure 20. In case the semiconductor substrate 8 is an SOI substrate, the depth of the second source/drain trenches 19 is less than the thickness of a top semiconductor layer, i.e., a buried insulator layer is not exposed at the bottom of the second source/drain trenches. Presence of the first semiconductor region 10 at the bottom of the second source/drain trenches 19 enables epitaxial alignment of a silicon-carbon alloy to be subsequently formed within the second source/drain trenches 19 to the lattice structure of the first semiconductor region 10. The depth of the second source/drain trenches 19 may be from about 10 nm to about 150 nm, and typically from about 20 nm to about 100 nm, although lesser and greater depths are contemplated herein also.

Figure 10:
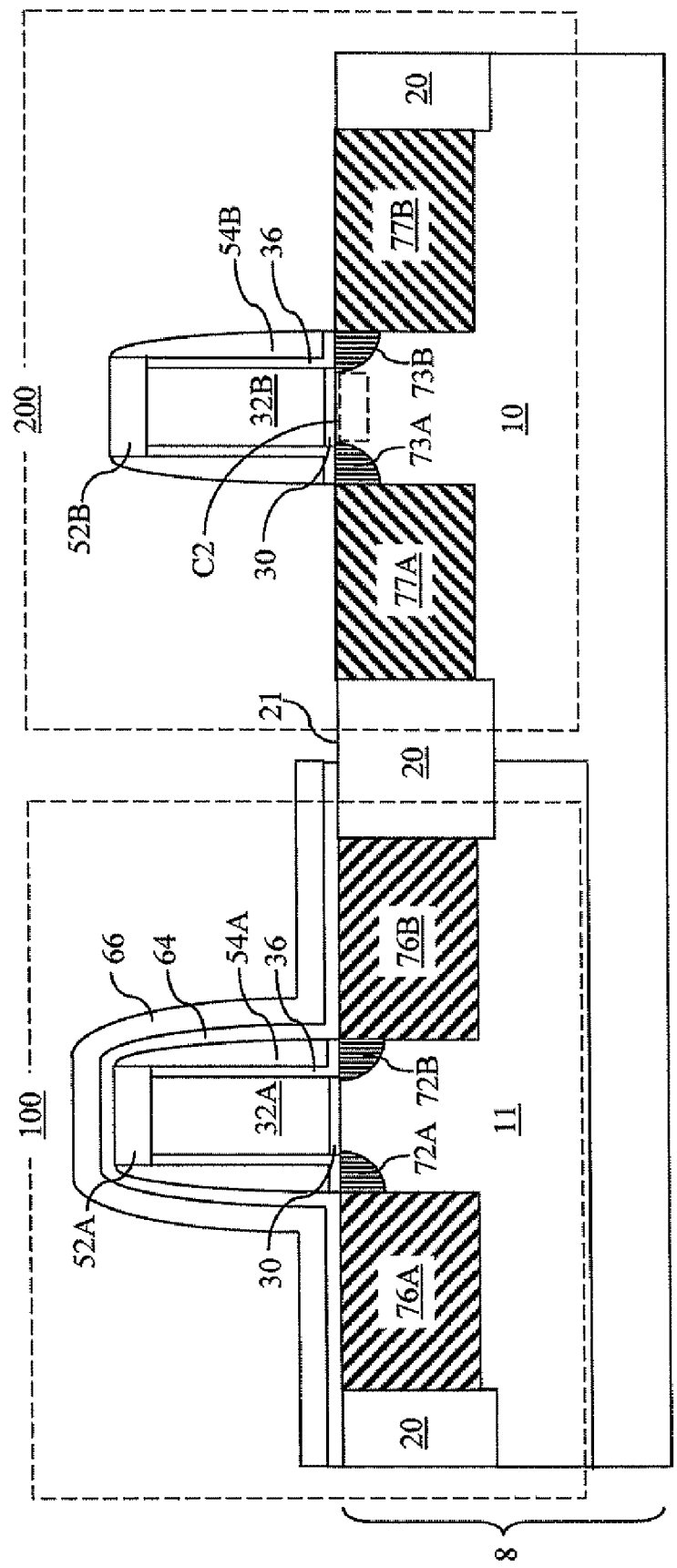

Referring to FIG. 10, embedded silicon-carbon regions are formed by in-situ doped selective epitaxy within the second source/drain trenches 19. The embedded silicon-carbon regions comprise single crystalline silicon-carbon alloy portions, and include an embedded silicon-carbon source region 77A and an embedded silicon-carbon drain region 77B, which are herein collectively termed "embedded source/drain silicon-carbon regions" (77A, 77B). The embedded silicon-carbon source/drain regions (77A, 77B) comprise a silicon carbon alloy having an n-type doping. Preferably, the embedded silicon-carbon source/drain regions (77A, 77B) comprise carbon from about 0.5% to about 4.0% in atomic concentration, although lesser and greater concentration are explicitly contemplated herein also. The embedded silicon-carbon source/drain regions (77A, 77B) comprise an n-type dopant, e.g., P, As, Sb, or a combination thereof, at a concentration from about $3.0 \times 10^{19}/cm^3$ to about $3.0 \times 10^{21}/cm^3$, and typically from about $1.0 \times 10^{20}/cm^3$ to about $1.0 \times 10^{21}/cm^3$, although lesser and greater concentrations are also contemplated herein.

The embedded silicon-carbon source/drain regions (77A, 77B) are epitaxially aligned to the first semiconductor region 10. Due to the forced epitaxial alignment of the embedded silicon-carbon source/drain regions (77A, 77B) to the first semiconductor region 10, the embedded silicon-carbon source/drain regions (77A, 77B) apply a tensile uniaxial stress to a second channel C2 directly underneath the gate dielectric 30 in the second device region 200.

Figure 11:
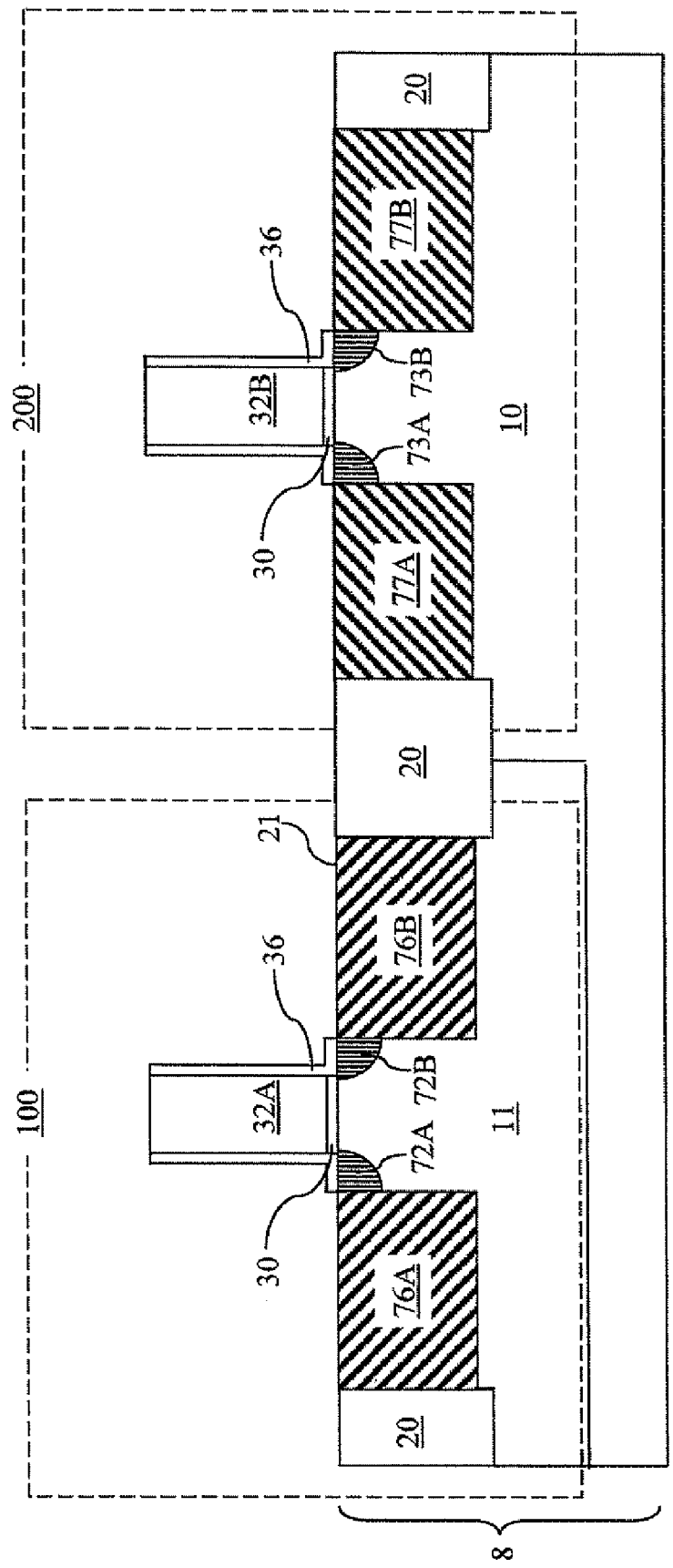

Referring to FIG. 11, the second dielectric layer 66, the etch-stop dielectric layer 64, the first and second silicon nitride caps (52A, 52B), and the first and second dummy gate spacers (54A, 54B) are removed employing a combination of etches. The silicon oxide layer 36, if present, may, or may not, be removed at this point. In case the first and second silicon nitride caps (52A, 52B) and the first and second dummy gate spacers (54A, 54B) comprise silicon nitride, an etch process that removes silicon nitride selective to silicon oxide may be employed to preserve the silicon oxide layer 36.

Figure 12:
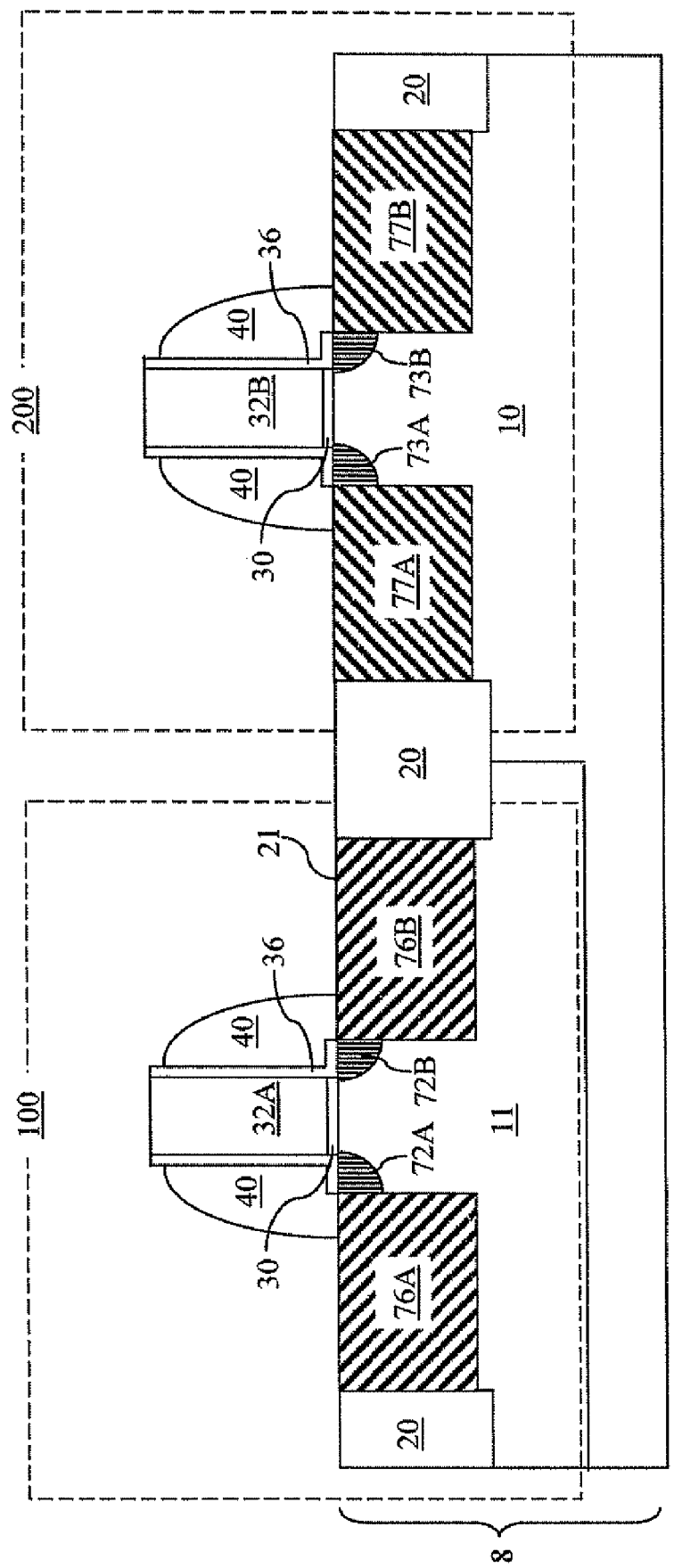

Referring to FIG. 12, gate spacers 40 comprising a dielectric material are formed on the sidewalls of the first and second gate conductors (32A, 32B) or on the sidewalls of the silicon oxide layer 36, if present, which surrounds the first and second gate conductors (32A, 32B). Preferably, the gate spacers 40 comprise a dielectric material having a low dielectric constant than silicon nitride to reduce parasitic capacitance between the first or second gate conductor (32A or 32B) and the embedded SiGe source/drain regions (76A, 76B) or the embedded silicon-carbon source/drain regions (77A, 77B). For example, the gate spacers may comprise silicon oxide, which has a dielectric constant of about 3.9, or a low dielectric constant material having a dielectric constant less than 3.9 such as porous or non-porous low-k dielectric material. The lateral width of the gate spacers 40 at the bottom is determined by the desired offset between the sidewalls of the first and second gate conductors (32A, 32B) and the metal semiconductor alloy portions to be subsequently formed on the embedded SiGe source/drain regions (76A, 76B) and the embedded silicon-carbon source/drain regions (77A, 77B).

Dopants are activated by a thermal anneal in the various doped regions, which include the embedded SiGe source/drain regions (76A, 76B), the embedded silicon-carbon source/drain regions (77A, 77B), the first silicon-containing source/drain extension regions (72A, 72B), the second silicon-containing source/drain extension regions (73A, 73B), the SiGe-alloy-containing source and drain extension regions (74A, 74B), and the silicon-carbon-alloy-containing source and drain extension regions (75A, 75B). The anneal temperature is controlled to prevent melting of any of the semiconductor materials, particularly the various silicon germanium alloys. Further, the anneal temperature is preferably maintained at a temperature lower than 1,080° C. so as to prevent relaxation of the various silicon-carbon alloys, i.e., to preserve the stress level originally applied by the various silicon-carbon alloys to surrounding structures. Various anneal processes may be employed for this purpose including a laser anneal, rapid thermal anneal, a furnace anneal, or a combination thereof.

Figure 13:
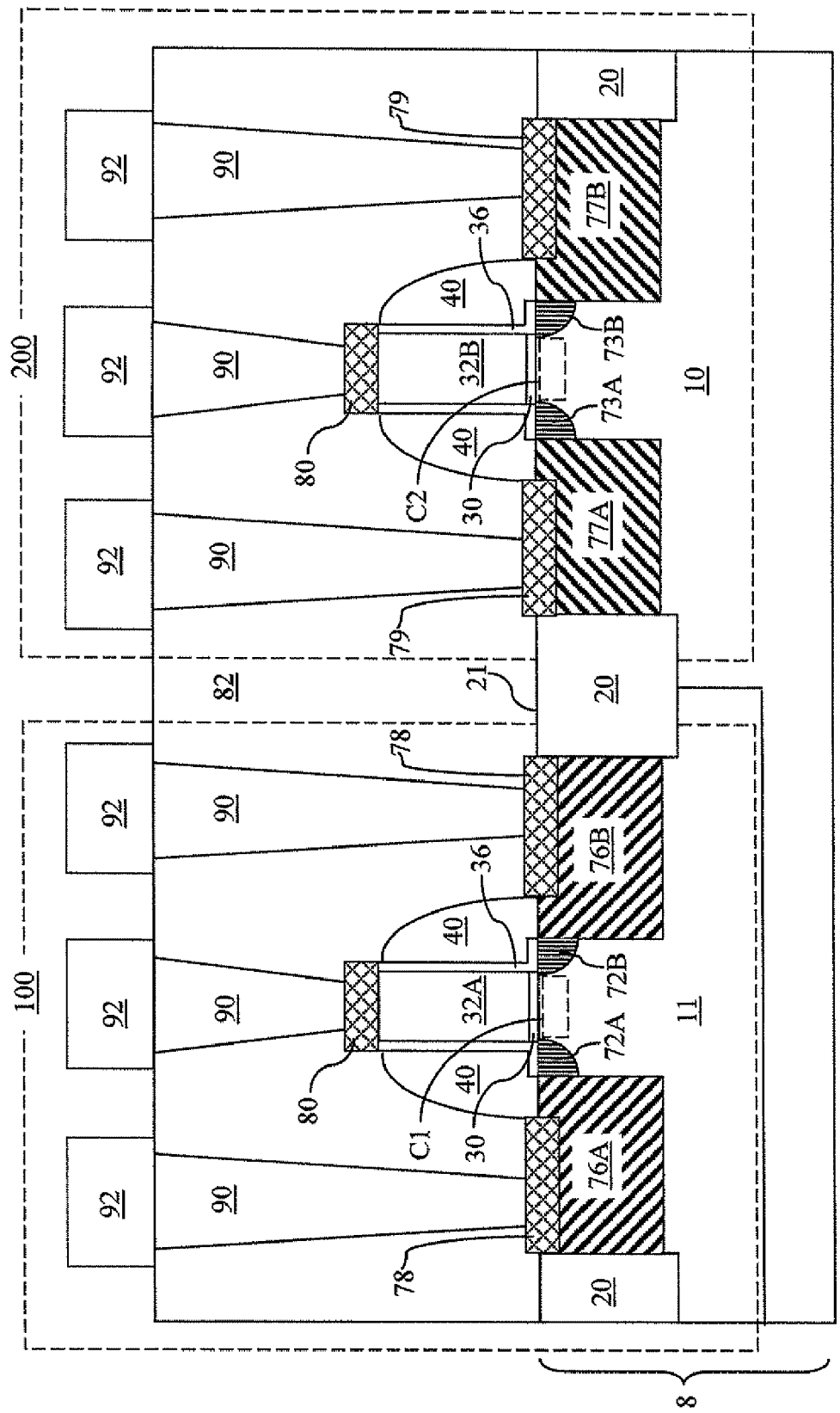

Referring to FIG. 13, metal semiconductor alloys are formed on exposed semiconductor surfaces by deposition of a metal layer (not shown) followed by an anneal that induces reaction of the metal layer with the underlying semiconductor material. Specifically, silicon-germanium-metal alloy portions 78 are formed on the embedded SiGe source/drain regions (76A, 76B) in the first device region 100, silicon-carbon-metal alloy portions 79 are formed on the embedded silicon-carbon source/drain regions (77A, 77B) in the second device region 200, and gate metal semiconductor alloy portions 80, which may comprise a metal silicide not containing Ge or C, are formed on the first gate conductor 32A in the first device region 100 and the on the second gate conductor 32B in the second device region 200. Methods of forming the various metal semiconductor alloy portions (78, 79, 80) are known in the art.

A middle-of-line (MOL) dielectric layer 82, which may include a mobile ion barrier layer (not shown), is deposited over the silicon-germanium-metal alloy portions 78, silicon-carbon-metal alloy portions 79, and the gate metal semiconductor alloy portions 80. The MOL dielectric layer 82 may comprise, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 82 and filled with metal to from various contact vias 90. A first level metal wiring 92 is thereafter formed followed by further formation of back-end-of-line (BEOL) structures.

Due to the epitaxial alignment with the second semiconductor region 11, the embedded SiGe source/drain regions (76A, 76B) apply a compressive uniaxial stress to the first channel C1 along the direction of the first channel C1, which is direction of current between the embedded SiGe source region 76A and the embedded SiGe drain region 76B, and is within the plane of the cross-section of FIG. 13. The embedded SiGe source/drain regions (76A, 76B), the first silicon-containing source/drain extension regions (72A, 72B), the first channel C1, the gate dielectric 30 directly on the first channel C1, and the first gate conductor 32A collectively form a p-type field effect transistor. The embedded SiGe source region 76A functions as the source of the p-type field effect transistor, while the embedded SiGe drain region 76B functions as the drain of the p-type field effect transistor. Hole mobility in the first channel C1 is enhanced by the compressive uniaxial stress along the direction of the first channel C1, and consequently, the on-current of the p-type field effect transistor is enhanced due to the compressive uniaxial stress.

Due to the epitaxial alignment with the first semiconductor region 10, the embedded silicon-carbon source/drain regions (77A, 77B) apply a tensile uniaxial stress to the second channel C2 along the direction of the second channel C2, which is direction of current between the embedded silicon-carbon source region 77A and the embedded silicon-carbon drain region 77B, and is within the plane of the cross-section of FIG. 13. The embedded silicon-carbon source/drain regions (77A, 77B), the second silicon-containing source/drain extension regions (73A, 73B), the second channel C2, the gate dielectric 30 directly on the second channel C2, and the second gate conductor 32B collectively form an n-type field effect transistor. The embedded silicon-carbon source region 77A functions as the source of the n-type field effect transistor, while the embedded silicon-carbon drain region 77B functions as the drain of the n-type field effect transistor. Electron mobility in the second channel C2 is enhanced by the tensile uniaxial stress along the direction of the second channel C2, and consequently, the on-current of the n-type field effect transistor is enhanced due to the tensile uniaxial stress.

Figure 14:
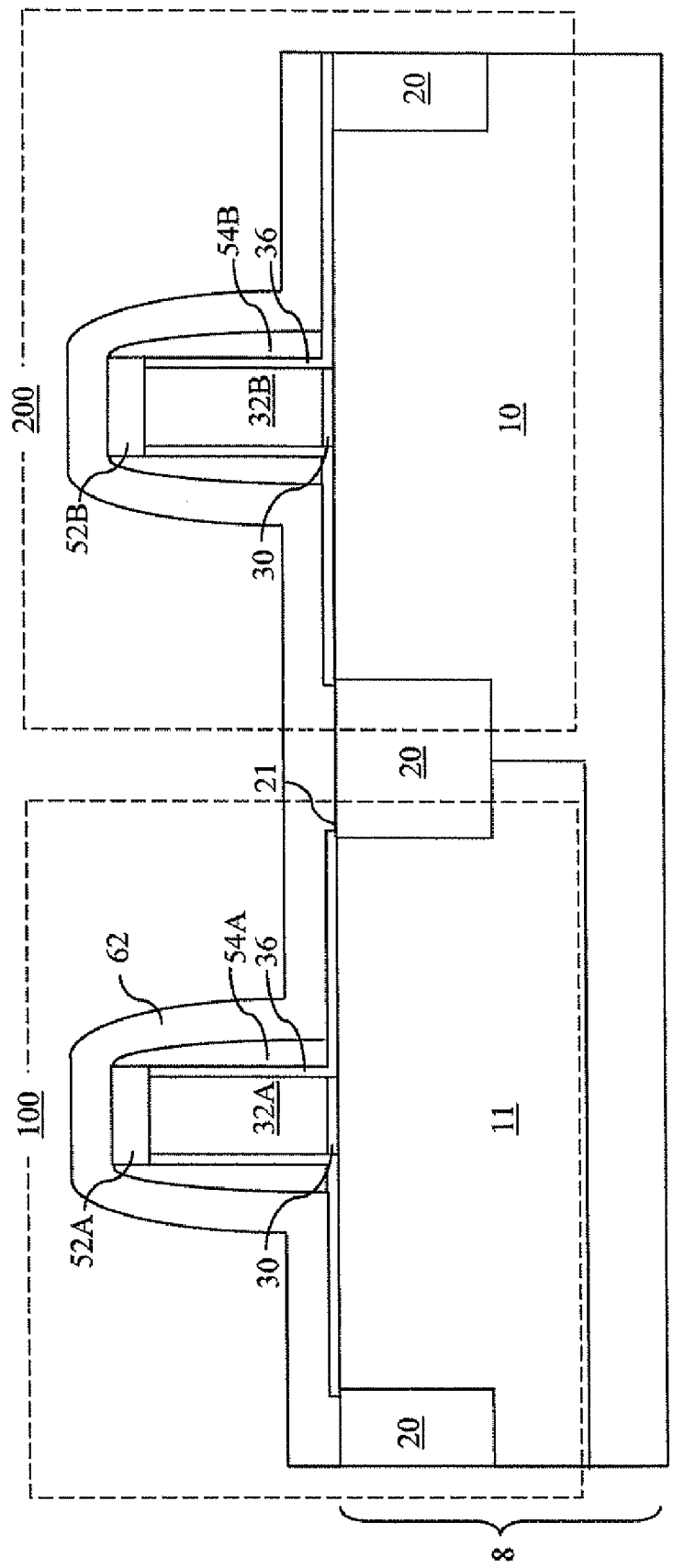
FIGS. 14-26 are sequential vertical cross-sectional views of a second exemplary semiconductor structure according to a second embodiment of the present invention.

Referring to FIG. 14, a second exemplary semiconductor structure according to a second embodiment of the present invention is derived from the first exemplary structure in FIG. 1. A first dielectric layer 62 is formed on the first and second dummy gate spacers (54A, 54B) and first and second gate nitride caps (52A, 52B). The first dielectric layer 62 comprises the same material, has the same thickness, and is formed by the same methods as in the first embodiment.

Figure 15:
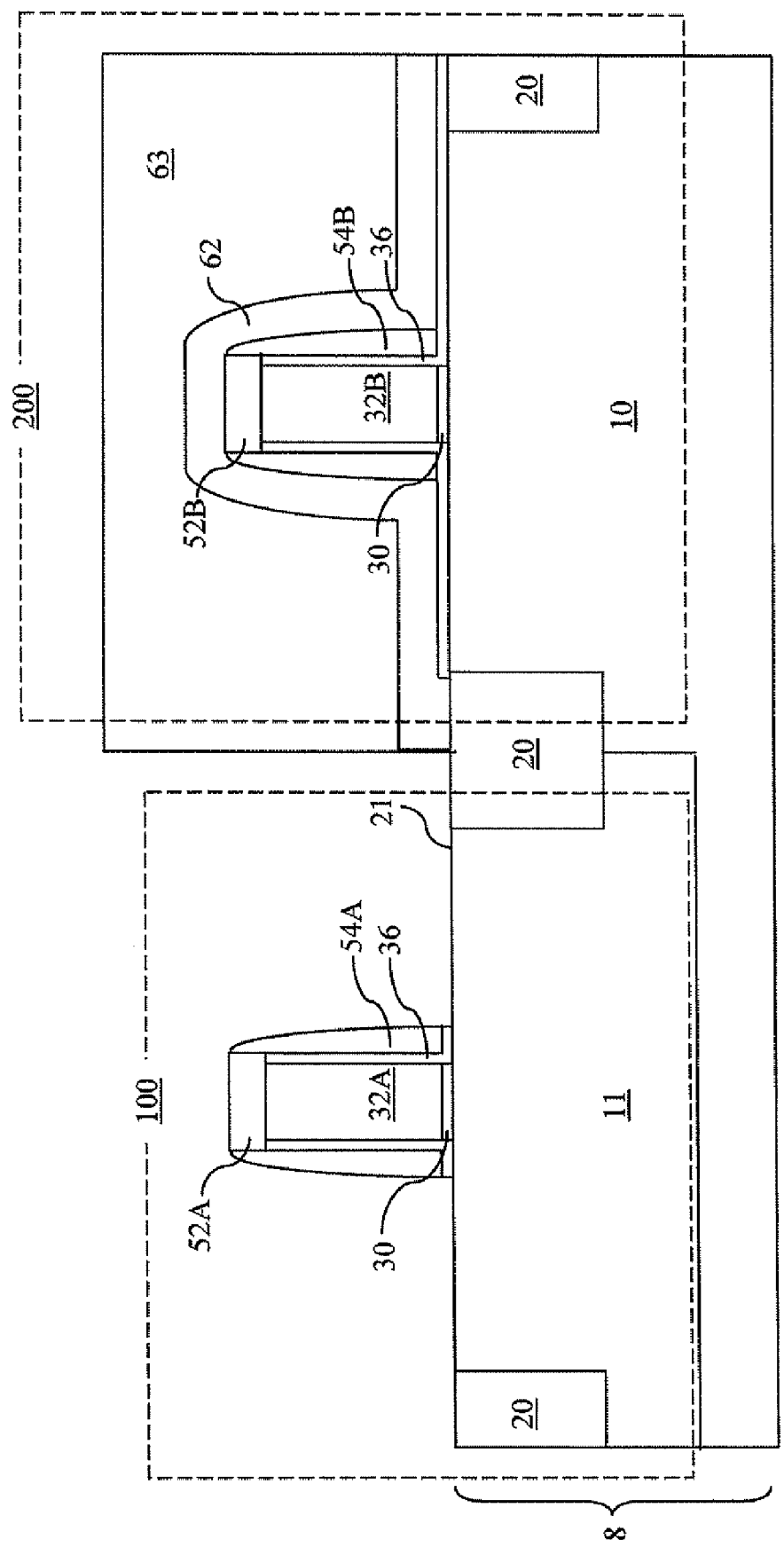

Referring to FIG. 15, a second photoresist 63 is applied to the first dielectric layer 62 and lithographically patterned to cover the second device region 200, while exposing the first device region 100. The portion of the first dielectric layer 62 in the first device region 100 is removed by an etch, which may be a dry etch or a wet etch. The exposed portion of the silicon oxide layer 36, if present, is removed. The top surface 21 of the semiconductor substrate 8 is exposed in the first device region 100. The second photoresist 63 may be removed at this step, or alternately, may be removed after the formation of first source/drain trenches to be subsequently formed at the next step. It is noted that an equivalent of the first photoresist 61 of the first embodiment is not employed in the second embodiment.

Figure 16:
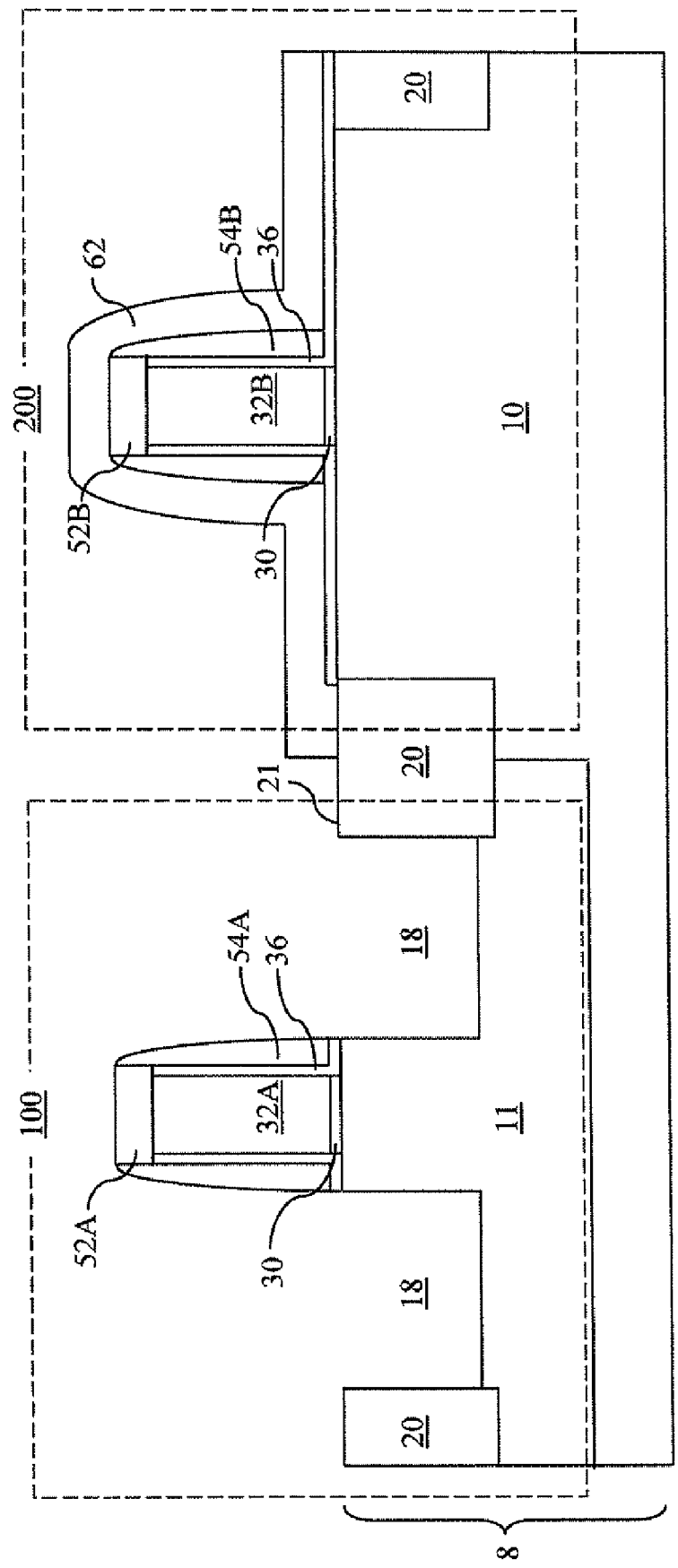

Referring to FIG. 16, first source/drain trenches 18 are formed by removing portions of the second semiconductor region 11 within the first device region 100 by an anisotropic etch such as a reactive ion etch. The first source/drain trenches 18 have the same structure, and are formed by the same methods, as in the first embodiment.

Figure 17:
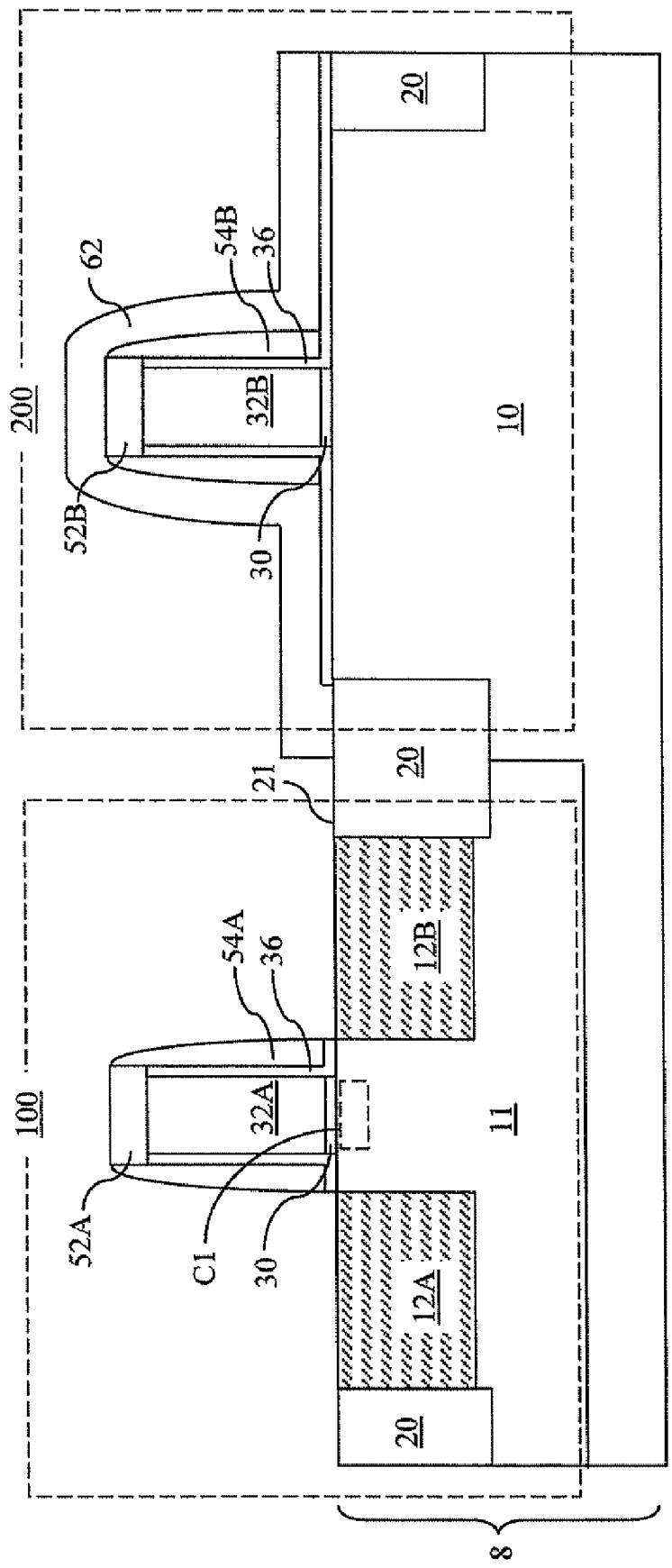

Referring to FIG. 17, embedded SiGe regions are formed by selective epitaxy within the first source/drain trenches 18. The embedded SiGe regions comprise single crystalline SiGe alloy portions, and include a source side embedded SiGe region 12A and a drain side embedded SiGe region 12B, which are herein collectively termed "embedded SiGe regions" (12A, 12B). Preferably, the embedded SiGe regions (12A, 12B) comprise germanium from about 15% to about 35% in atomic concentration, although lesser and greater concentration are explicitly contemplated herein also. The embedded SiGe regions (12A, 12B) may be substantially undoped, i.e., substantially free of electrical dopants such as B, Ga, In, P, As, and Sb, or may be lightly n-doped, i.e., comprise an ntype dopant, e.g., P, As, Sb, or a combination thereof at a concentration from about $1.0 \times 10^{15}/cm^3$ to about $3.0 \times 10^{18}/cm^3$, and preferably from about $1.0 \times 10^{15}/cm^3$ to about $3.0 \times 10^{17}/cm^3$. In case the embedded SiGe regions (12A, 12B) are substantially undoped, the doping concentration of the embedded SiGe regions (12A, 12B) is less than $1.0 \times 10^{15}/cm^3$. In case the embedded SiGe regions (12A, 12B) are lightly n-doped, such light n-type doping may be effected by in-situ doping.

The embedded SiGe regions (12A, 12B) are epitaxially aligned to the second semiconductor region 11. Due to the forced epitaxial alignment of the embedded SiGe regions (12A, 12B) to the second semiconductor region 11, the embedded SiGe regions (12A, 12B) apply a compressive uniaxial stress to a first channel C1 directly underneath the gate dielectric 30 in the first device region 100.

Figure 18:
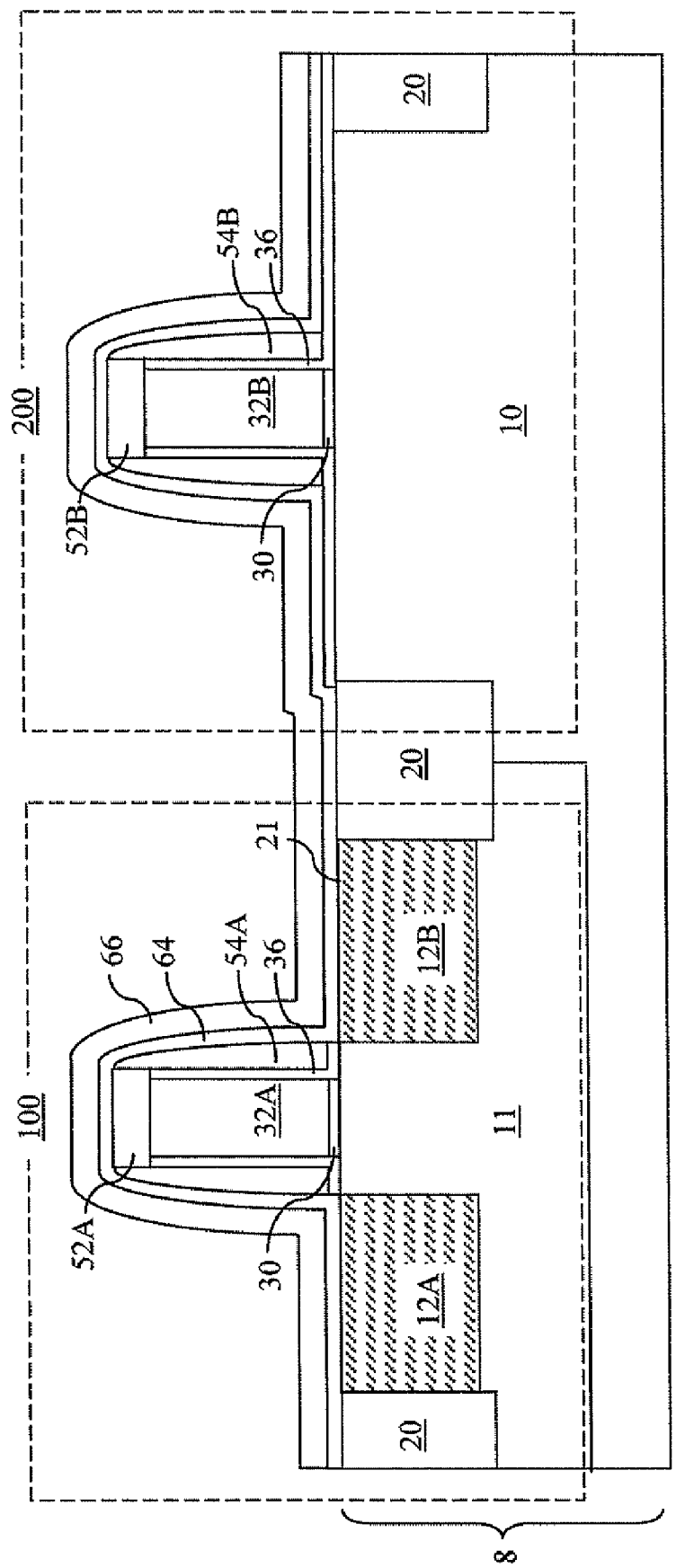

Referring to FIG. 18, an etch-stop dielectric layer 64 and a second dielectric layer 66 are formed on the embedded SiGe regions (12A, 12B) and the first and second dummy gate spacers (54A, 54B). The composition and thickness of the second dielectric layer 66 are the same as in the first embodiment. The composition and thickness of the etch-stop dielectric layer 64 are the same as in the first embodiment as well.

Figure 19:
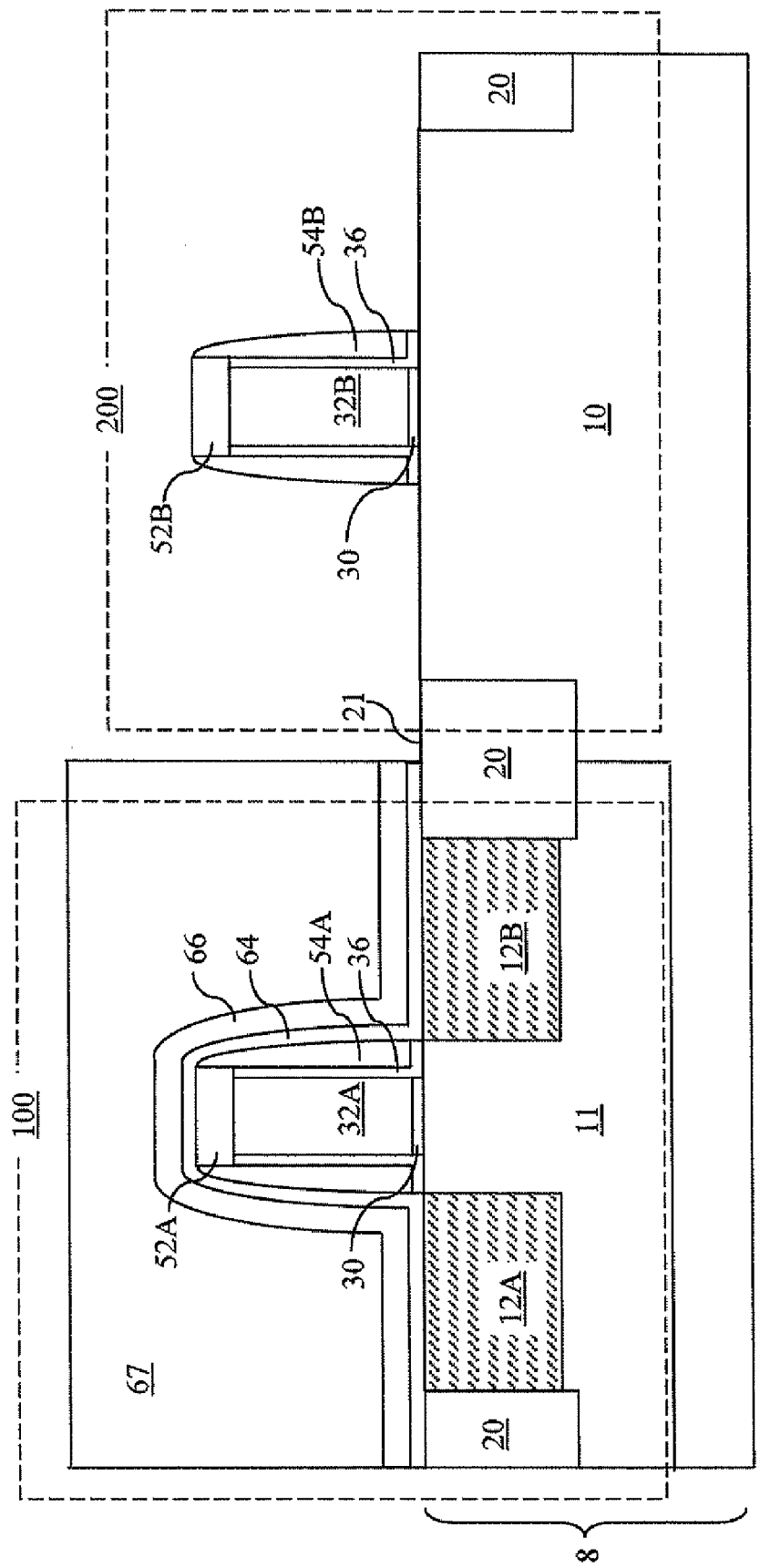

Referring to FIG. 19, a third photoresist 67 is applied over the second dielectric layer 66 and lithographically patterned to expose the second device region 200, while blocking the first device region 100. The exposed portions of the second dielectric layer 66 in the second device region 200 is removed by a first etch, which may be a wet etch or a dry etch employing the third photoresist 67 as an etch mask as in the first embodiment. Exposed portions of the etch-stop dielectric layer 64 in the second device region 200 are also removed as in the first embodiment. The third photoresist 67 is subsequently removed.

Figure 20:
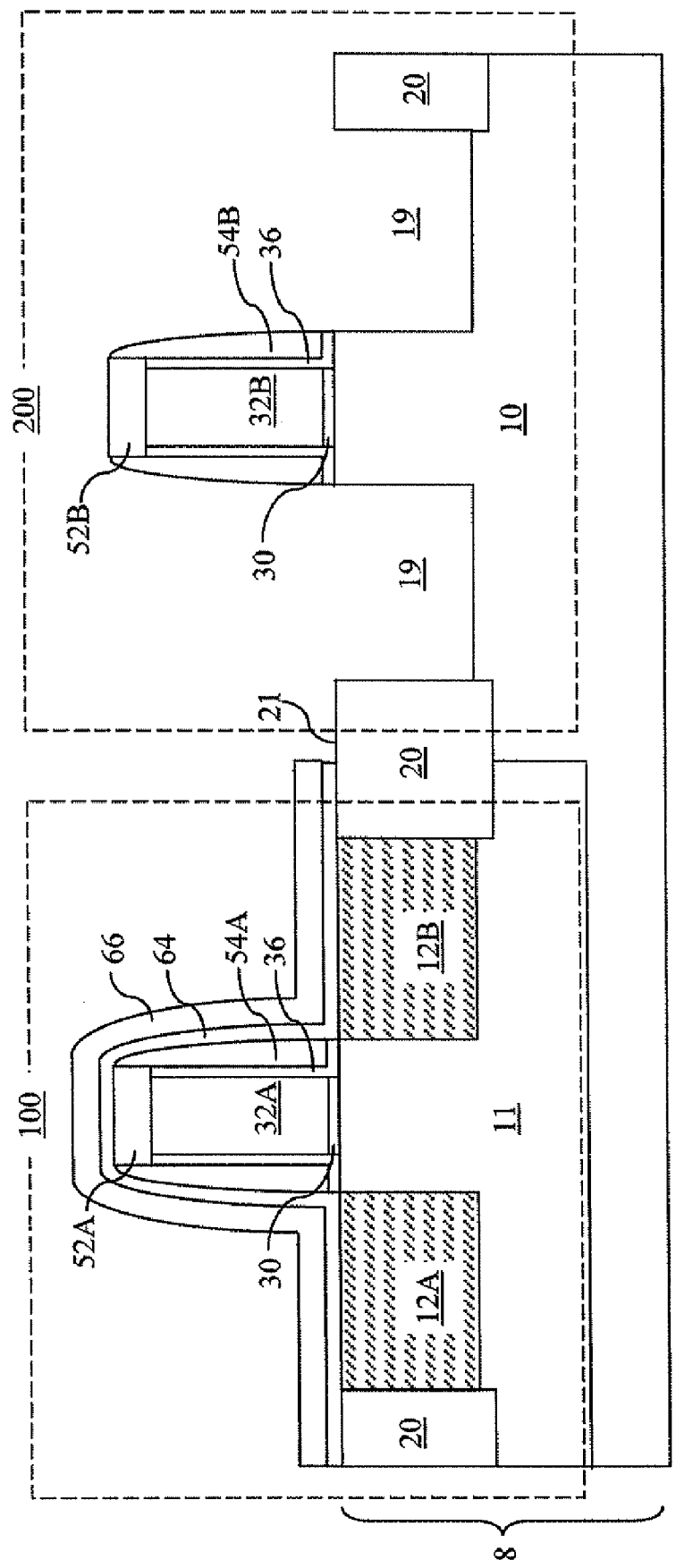

Referring to FIG. 20, second source/drain trenches 19 are formed by removing portions of the first semiconductor region 10 within the second device region 200 by an anisotropic etch such as a reactive ion etch. The second source/drain trenches 19 include a second source side trench formed on one side of the second gate electrode and a second drain side trench formed on the other side of the second gate electrode. The second source/drain trenches 19 have the same structure, and are formed by the same methods, as in the first embodiment.

Figure 21:
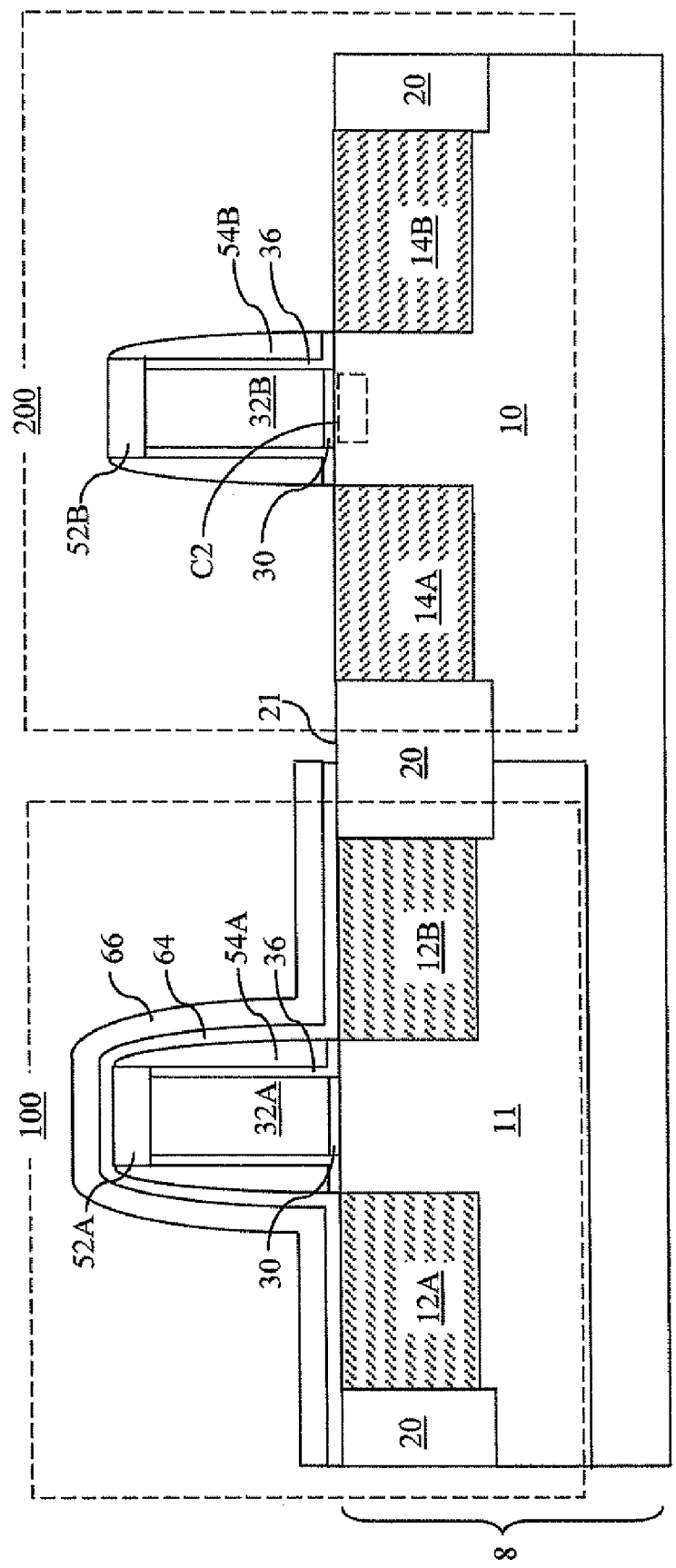

Referring to FIG. 21, embedded silicon-carbon regions are formed by in-situ doped selective epitaxy within the second source/drain trenches 19. The embedded silicon-carbon regions comprise single crystalline silicon-carbon alloy portions, and include a source side embedded silicon-carbon region 14A and a drain side embedded silicon-carbon region 14B, which are herein collectively termed "embedded silicon-carbon regions" (14A, 14B). Preferably, the embedded silicon-carbon regions (14A, 14B) comprise carbon from about 0.5% to about 4.0% in atomic concentration, although lesser and greater concentration are explicitly contemplated herein also. The embedded silicon-carbon regions (14A, 14B) may be substantially undoped, i.e., substantially free of electrical dopants such as B, Ga, In, P, As, and Sb, or may be lightly p-doped, i.e., comprise an p-type dopant, e.g., B, Ga, In, or a combination thereof, at a concentration from about $1.0 \times 10^{15}/cm^3$ to about $3.0 \times 10^{18}/cm^3$, and preferably from about $1.0 \times 10^{15}/cm^3$ to about $3.0 \times 10^{17}/cm^3$. In case the embedded silicon-carbon regions (14A, 14B) are substantially undoped, the doping concentration of the embedded silicon-carbon regions (14A, 14B) is less than $1.0 \times 10^{15}/cm^3$. In case the embedded silicon-carbon regions (14A, 14B) are lightly p-doped, such light p-type doping may be effected by in-situ doping.

The embedded silicon-carbon regions (14A, 14B) are epitaxially aligned to the first semiconductor region 10. Due to the forced epitaxial alignment of the embedded silicon-carbon regions (14A, 14B) to the first semiconductor region 10, the embedded silicon-carbon regions (14A, 14B) apply a tensile uniaxial stress to a second channel C2 directly underneath the gate dielectric 30 in the second device region 200.

Figure 22:
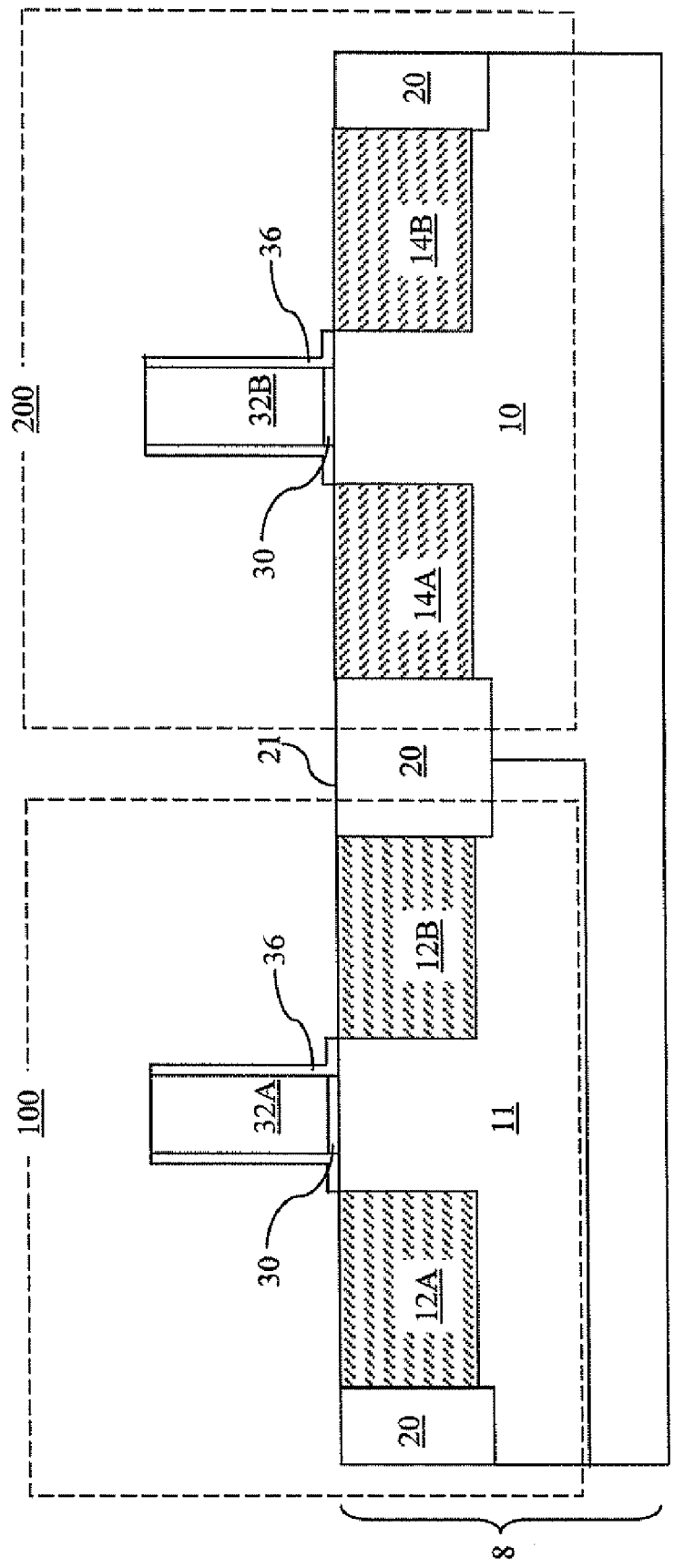

Referring to FIG. 22, the second dielectric layer 66, the etch-stop dielectric layer 64, the first and second silicon nitride caps (52A, 52B), and the first and second dummy gate spacers (54A, 54B) are removed employing a combination of etches. The silicon oxide layer 36, if present, may, or may not, be removed at this point. In case the first and second silicon nitride caps (52A, 52B) and the first and second dummy gate spacers (54A, 54B) comprise silicon nitride, an etch process that removes silicon nitride selective to silicon oxide may be employed to preserve the silicon oxide layer 36.

Figure 23:
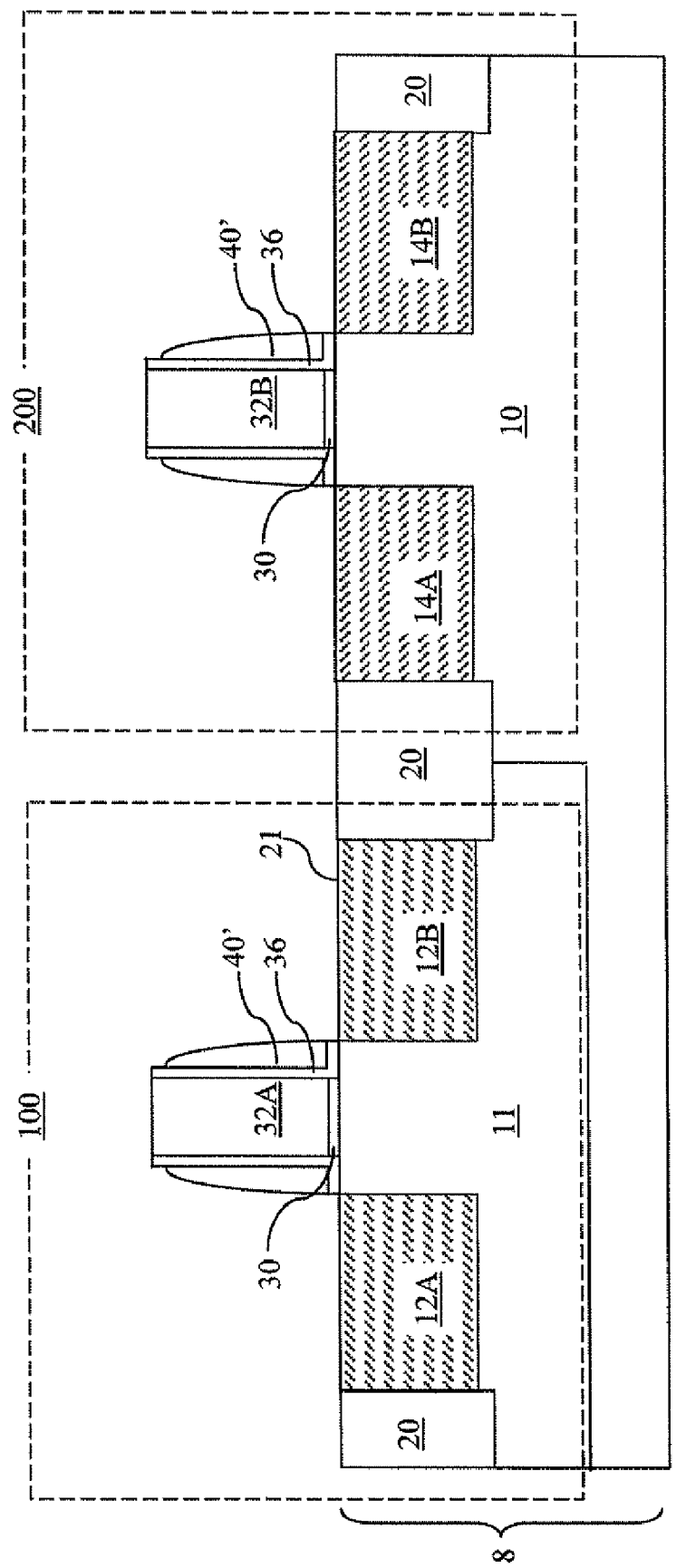

Referring to FIG. 23, gate spacers 40' comprising a dielectric material are formed on the sidewalls of the first and second gate conductors (32A, 32B) or on the sidewalls of the silicon oxide layer 36, if present, which surrounds the first and second gate conductors (32A, 32B). Preferably, the gate spacers 40' comprise a dielectric material having a low dielectric constant than silicon nitride to reduce parasitic capacitance between the first or second gate conductor (32A or 32B) and the embedded SiGe regions (12A, 12B) or the embedded silicon-carbon regions (14A, 14B). For example, the gate spacers may comprise silicon oxide, which has a dielectric constant of about 3.9, or a low dielectric constant material having a dielectric constant less than 3.9 such as porous or non-porous low-k dielectric material.

The thickness of the gate spacers 40' may be adjusted to optimize the offset distance of source/drain extension regions to be subsequently formed from the sidewalls of the first gate conductor 32A and the second gate conductor 32B. The gate spacers 40' have a thickness from about 3 nm to about 30 nm, and typically from about 5 nm to about 20 nm, although lesser and greater thicknesses are contemplated herein also.

Figure 24:
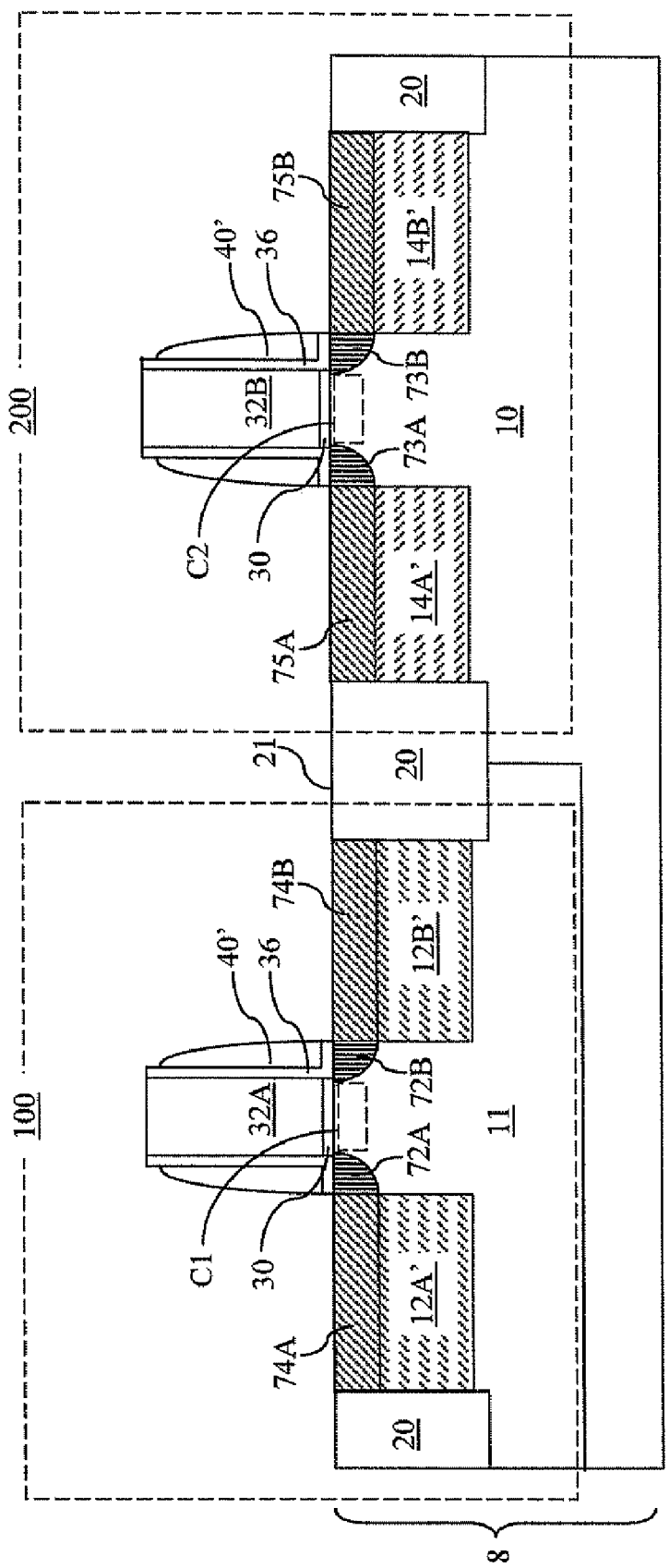

Referring to FIG. 24, masked ion implantation steps are performed employing block level masks to form various source/drain extension regions. Specifically, p-type dopants are implanted into top portions of the second semiconductor region 11 and the embedded SiGe regions (12A, 12B) to form first source/drain extension regions, which comprise a first silicon-containing source extension region 72A, a first silicon-containing drain extension region 72B, a SiGe-alloy-containing source extension region 74A, and a SiGe-alloy-containing drain extension region 74B. Likewise, n-type dopants are implanted into top portions of the first semiconductor region 10 and the embedded silicon carbon regions (14A, 14B) to form second source/drain extension regions, which comprise a second silicon-containing source extension region 73A, a second silicon-containing drain extension region 73B, a silicon-carbon-alloy-containing source extension region 75A, and a silicon-carbon-alloy-containing drain extension region 75B. Halo implantations may be performed employing the same block level masks as needed.

The first source/drain extension regions (72A, 72B, 74A, 74B) are p-doped and has a dopant concentration from about $3.0\times10^{18}/cm^3$ to about $3.0\times10^{21}/cm^3$, and typically from about $3.0\times10^{19}/cm^3$ to about $3.0\times10^{20}/cm^3$, although lesser and greater dopant concentrations are herein contemplated also. The second source/drain extension regions (73A, 73B, 75A, 75B) are n-doped and has a dopant concentration from about $3.0\times10^{18}/cm^3$ to about $3.0\times10^{21}/cm^3$, and typically from about $3.0\times10^{19}/cm^3$ to about $3.0\times10^{20}/cm^3$, although lesser and greater dopant concentrations are herein contemplated also. The portions of the embedded SiGe regions (12A, 12B) that are not implanted by p-type dopants are herein referred to as lower embedded SiGe portions (12A', 12B'). The portions of the embedded silicon-carbon regions (14A, 14B) that are not implanted by n-type dopants are herein referred to as lower embedded silicon-carbon portions (14A', 14B'), which comprises a source side lower embedded silicon-carbon portion 14A' and a drain side lower embedded silicon-carbon portion 14B'.

Figure 25:
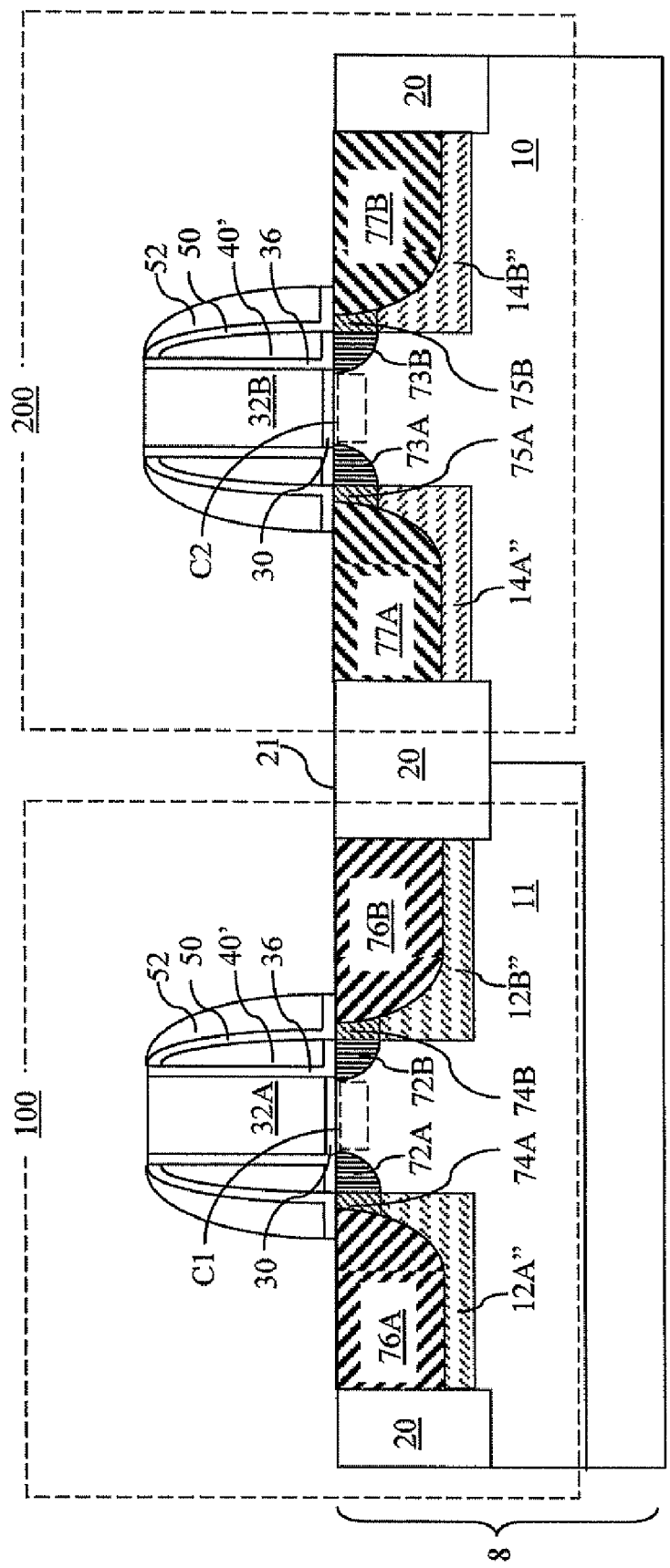

Referring to FIG. 25, secondary gate spacers 50 and tertiary gate spacers 52 are formed on and around the gate spacers 40' in the first and second device regions (100, 200). The secondary gate spacers 50 and the tertiary gate spacers 52 comprise dielectric materials that may be the same or different as the material of the gate spacer 40'. For example, the secondary gate spacers 50 and the tertiary gate spacers 52 may comprise silicon nitride, silicon oxide, or porous or non-porous low-k dielectric material having a dielectric constant less than 3.9. The combined width of the first gate spacer 40', the secondary gate spacers 50 and the tertiary gate spacers 52 is determined by the desired offset between the sidewalls of the first and second gate conductors (32A, 32B) and the metal semiconductor alloy portions to be subsequently formed on the embedded SiGe regions and the embedded silicon-carbon regions.

Additional masked ion implantation steps are performed employing block level masks to form various source/drain regions. Specifically, p-type dopants are implanted into portions of the SiGe-alloy-containing source/drain extension regions (74A, 74B) and the lower embedded SiGe portions (12A', 12B') to form an embedded SiGe source region 76A and an embedded SiGe drain region 76B. The first silicon-containing source extension region 72A and the first silicon-containing drain extension region 72B are shrunk to regions that are not implanted with the p-type dopants at this step. The sub-portion of the source side lower embedded SiGe portion 12A' that is not implanted by the p-type dopants is herein referred to as a source side embedded SiGe body region 12A". Likewise, n-type dopants are implanted into portions of the silicon-carbon-alloy-containing source/drain extension region (75A, 75B) and the lower embedded silicon-carbon portions (14A', 14B') to form an embedded silicon-carbon source region 77A and an embedded silicon-carbon drain region 77B. The second silicon-containing source extension region 73A and the second silicon-containing drain extension region 73B are shrunk to regions that are not implanted with the n-type dopants at this step. The sub-portion of the drain side lower embedded SiGe portion 12B' that is not implanted by the p-type dopants is herein referred to as a drain side embedded SiGe body region 12B".

Dopants are activated by a thermal anneal in the various doped regions, which include the embedded SiGe source/drain regions (76A, 76B), the embedded silicon-carbon source/drain regions (77A, 77B), the first silicon-containing source/drain extension regions (72A, 72B), the second silicon-containing source/drain extension regions (73A, 73B), the SiGe-alloy-containing source and drain extension regions (74A, 74B), and the silicon-carbon-alloy-containing source and drain extension regions (75A, 75B). The anneal temperature is controlled to prevent melting of any of the semiconductor materials, particularly the various silicon germanium alloys. Further, the anneal temperature is preferably maintained at a temperature lower than 1,080° C. so as to prevent relaxation of the various silicon-carbon alloys, i.e., to preserve the stress level originally applied by the various silicon-carbon alloys to surrounding structures. Various anneal processes may be employed for this purpose including a laser anneal, rapid thermal anneal, a furnace anneal, or a combination thereof.

Figure 26:
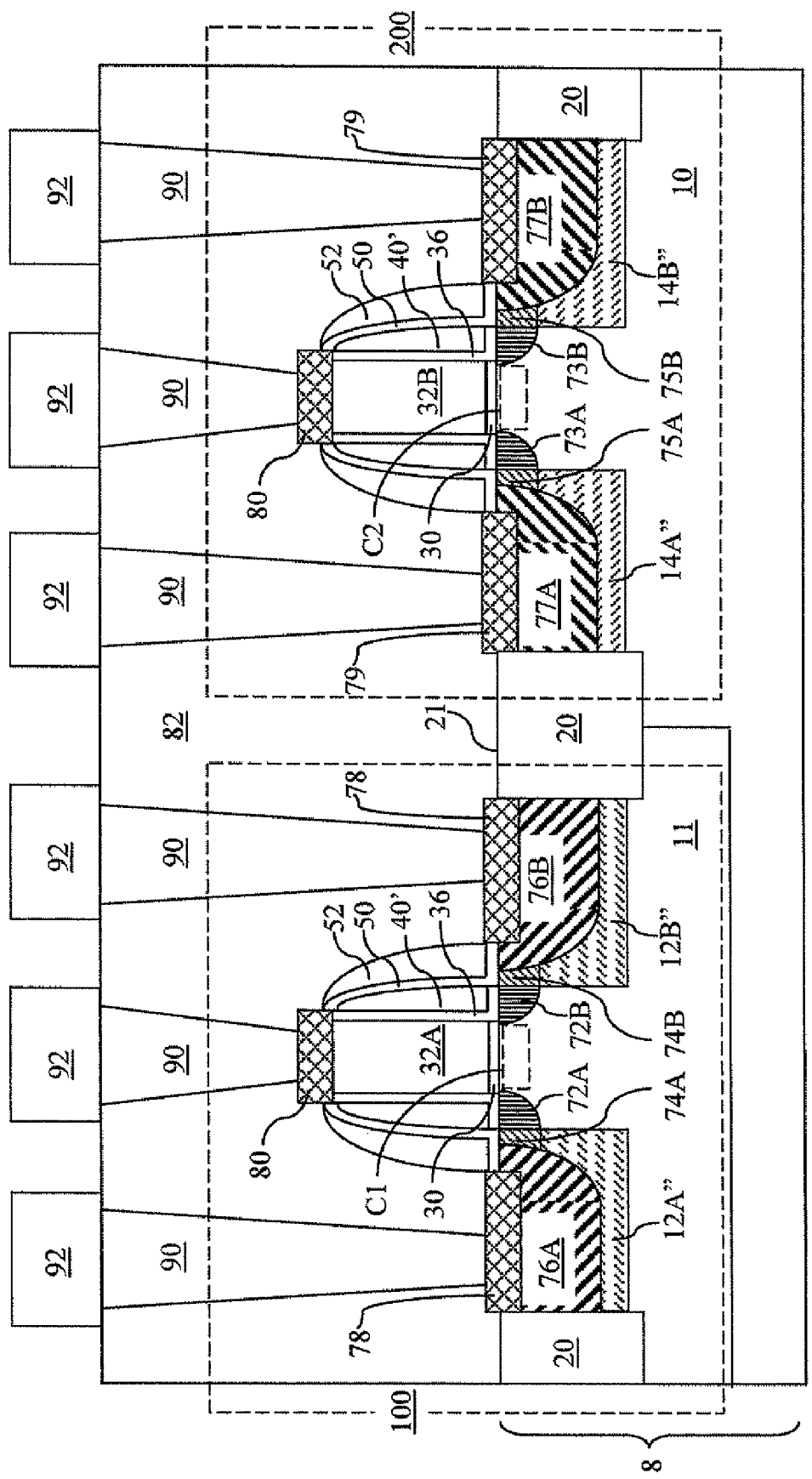

Referring to FIG. 26, metal semiconductor alloys are formed on exposed semiconductor surfaces as in the first embodiment. Specifically, silicon-germanium-metal alloy portions 78 are formed on the embedded SiGe source/drain regions (76A, 76B) in the first device region 100, silicon-carbon-metal alloy portions 79 are formed on the embedded silicon-carbon source/drain regions (77A, 77B) in the second device region 200, and gate metal semiconductor alloy portions 80, which may comprise a metal silicide not containing Ge or C, are formed on the first gate conductor 32A in the first device region 100 and the on the second gate conductor 32B in the second device region 200. A middle-of-line (MOL) dielectric layer 82, various contact vias 90, and a first level metal wiring 92 is thereafter formed as in the first embodiment.

The second exemplary semiconductor structure comprises a p-type field effect transistor in the first device region 100 and an n-type field effect transistor in the second device region 200. The embedded SiGe source region 76A functions as the source of the p-type field effect transistor, while the embedded SiGe drain region 76B functions as the drain of the p-type field effect transistor. The first silicon-containing source extension region 72A and the SiGe-alloy-containing source extension region 74A collectively function as a source extension region of the p-type field effect transistor, while the first silicon-containing drain extension region 72B and the SiGe-alloy-containing drain extension region 74B collectively function as a drain extension region of the p-type field effect transistor. The source side embedded SiGe body region 12A", the drain side embedded SiGe body region 12B", and the portion of the second semiconductor region 11 within the first device region 100 collectively function as a body of the p-type field effect transistor.

In the same manner, the embedded silicon-carbon source region 77A functions as the source of the n-type field effect transistor, while the embedded silicon-carbon drain region 77B functions as the drain of the n-type field effect transistor. The second silicon-containing source extension region 73A and the silicon-carbon-alloy-containing source extension region 75A collectively function as a source extension region of the n-type field effect transistor, while the second silicon-containing drain extension region 73B and the silicon-carbon-alloy-containing drain extension region 75B collectively function as a drain extension region of the n-type field effect transistor. The source side embedded silicon-carbon body region 14A", the drain side embedded silicon-carbon body region 14B", and the portion of the first semiconductor region 10 within the first device region 100 collectively function as a body of the n-type field effect transistor.

The source side embedded SiGe body region 12A", the drain side embedded SiGe body region 12B", the embedded SiGe source region 76A, and the embedded SiGe drain region 76B, which are collectively referred to as embedded SiGe regions (12A", 12B", 76A, 76B), comprise a silicon-germanium alloy. The source side embedded silicon-carbon body region 14A", the drain side embedded silicon-carbon body region 14B", the embedded silicon-carbon source region 77A, and the embedded silicon-carbon drain region 77B, which are collectively referred to as embedded silicon-carbon regions (14A", 14B", 77A, 77B), comprise a silicon-carbon alloy. The first and second silicon-containing source/drain extension regions (72A, 72B, 73A, 73B), the first semiconductor region 10, and the second semiconductor region 11 comprise silicon.

Due to the epitaxial alignment with the second semiconductor region 11, the embedded SiGe regions (12A", 12B", 76A, 76B) apply a compressive uniaxial stress to the first channel C1 along the direction of the first channel C1, which is direction of current between the embedded SiGe source region 76A and the embedded SiGe drain region 76B, and is within the plane of the cross-section of FIG. 26. Hole mobility in the first channel C1 is enhanced by the compressive uniaxial stress along the direction of the first channel C1, and consequently, the on-current of the p-type field effect transistor is enhanced due to the compressive uniaxial stress.

Due to the epitaxial alignment with the first semiconductor region 10, the embedded silicon-carbon regions (14A", 14B", 77A, 77B) apply a tensile uniaxial stress to the second channel C2 along the direction of the second channel C2, which is direction of current between the embedded silicon-carbon source region 77A and the embedded silicon-carbon drain region 77B, and is within the plane of the cross-section of FIG. 26. Electron mobility in the second channel C2 is enhanced by the tensile uniaxial stress along the direction of the second channel C2, and consequently, the on-current of the n-type field effect transistor is enhanced due to the tensile uniaxial stress.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming and patterning a first dielectric layer on a semiconductor substrate, wherein a first device region containing a first gate stack is exposed, while a second device region containing a second gate stack is masked by said first dielectric layer;
   forming embedded SiGe regions in said first device region by a first selective epitaxy on both sides of said first gate stack;
   forming and patterning a second dielectric layer on said embedded SiGe regions, wherein an area containing said second gate stack is exposed, while said first device region containing said first gate stack is masked by said second dielectric layer; and
   forming embedded silicon-carbon regions in said second device region by a second selective epitaxy on both sides of said second gate stack.

2. The method of forming a semiconductor structure according to claim 1, further comprising forming first source/drain trenches in said first device region by etching silicon from exposed surfaces of said first device region, while said first dielectric layer protects said second device region, wherein said embedded SiGe regions are subsequently formed in said first source/drain trenches.

3. The method of forming a semiconductor structure according to claim 2, further comprising forming a first gate spacer on said first gate stack, wherein edges of said first source/drain trenches are substantially coincident with sidewalls of said first gate spacer.

4. The method of forming a semiconductor structure according to claim 2, further comprising forming first source/drain extension regions having a p-type doping in said first device region prior to said forming of said first source/drain trenches, wherein said first source/drain extension regions are self-aligned to said first gate spacer.

5. The method of forming a semiconductor structure according to claim 2, wherein said embedded SiGe regions are substantially undoped or n-doped.

6. The method of forming a semiconductor structure according to claim 5, further comprising implanting p-type dopants into upper portions of said embedded SiGe regions to form embedded SiGe source/drain regions.

7. The method of forming a semiconductor structure according to claim 6, wherein portions of said embedded SiGe regions are substantially free of said p-type dopants and constitute embedded SiGe body regions.

8. The method of forming a semiconductor structure according to claim 2, wherein said embedded SiGe regions are doped in-situ with p-type dopants during said first selective epitaxy.

9. The method of forming a semiconductor structure according to claim 1, further comprising forming second source/drain trenches in said second device region by etching silicon from exposed surfaces of said second device region, while said second dielectric layer protects said first device region, wherein said embedded silicon-carbon regions are subsequently formed in said second source/drain trenches.

10. The method of forming a semiconductor structure according to claim 9, further comprising forming a second gate spacer on said second gate stack, wherein edges of said second source/drain trenches are substantially coincident with sidewalls of said second gate spacer.

11. The method of forming a semiconductor structure according to claim 9, further comprising forming second source/drain extension regions having an n-type doping in said second device region prior to said forming of said second source/drain trenches, wherein said second source/drain extension regions are self-aligned to said second gate spacer.

12. The method of forming a semiconductor structure according to claim 9, further comprising implanting n-type dopants into upper portions of said embedded silicon-carbon regions to form embedded silicon-carbon source/drain regions.

13. The method of forming a semiconductor structure according to claim 12, wherein portions of said embedded silicon-carbon regions are substantially free of said n-type dopants and constitute embedded silicon-carbon body regions.

14. The method of forming a semiconductor structure according to claim 9, wherein said embedded silicon-carbon regions are doped in-situ with n-type dopants during said second selective epitaxy.

15. The method of forming a semiconductor structure according to claim 1, wherein said first dielectric layer and said second dielectric layer comprise silicon nitride.

16. The method of forming a semiconductor structure according to claim 15, further comprising forming an etch-stop dielectric layer comprising silicon directly on said embedded SiGe regions, wherein said second dielectric layer is formed directly on said etch-stop dielectric layer.

17. The method of forming a semiconductor structure according to claim 16, further comprising:
- forming a silicon oxide layer directly on said first gate stack and said second gate stack;
- forming a first spacer on said silicon oxide layer in said first device region and a second spacer on said silicon oxide layer in said second device region, wherein said first and second spacers comprise silicon nitride; and
- forming a first silicon nitride cap on said first gate stack and a second silicon nitride cap on said second gate stack, wherein said first dielectric layer is formed on said first and second nitride caps and said first and second spacers.

18. The method of forming a semiconductor structure according to claim 1, further comprising:
- forming a silicon oxide layer directly on said first gate stack and said second gate stack;
- forming a first spacer on said silicon oxide layer in said first device region and a second spacer on said silicon oxide layer in said second device region, wherein said first and second spacers comprise silicon nitride; and
- forming a first silicon nitride cap on said first gate stack and a second silicon nitride cap on said second gate stack, wherein said first dielectric layer is formed on said first and second nitride caps and said first and second spacers.

19. A method of forming a semiconductor structure comprising:
- forming and patterning a first dielectric layer on a semiconductor substrate, wherein a first device region containing a first gate stack is exposed, while a second device region containing a second gate stack is masked by said first dielectric layer;
- forming first source/drain trenches in said first device region by etching silicon from exposed surfaces of said first device region, while said first dielectric layer protects said second device region;
- forming embedded SiGe regions in said first device region by a first selective epitaxy, wherein said embedded SiGe regions are formed in said first source/drain trenches and said embedded SiGe regions comprise Ge from about 15% to about 35% in atomic concentration;
- forming and patterning a second dielectric layer on said embedded SiGe regions, wherein an area containing said second gate stack is exposed, while said first device region containing said first gate stack is masked by said second dielectric layer; and
- forming embedded silicon-carbon regions in said second device region by a second selective epitaxy.

20. A method of forming a semiconductor structure comprising:
- forming and patterning a first dielectric layer on a semiconductor substrate, wherein a first device region containing a first gate stack is exposed, while a second device region containing a second gate stack is masked by said first dielectric layer;
- forming embedded SiGe regions in said first device region by a first selective epitaxy;
- forming and patterning a second dielectric layer on said embedded SiGe regions, wherein an area containing said second gate stack is exposed, while said first device region containing said first gate stack is masked by said second dielectric layer;
- forming second source/drain trenches in said second device region by etching silicon from exposed surfaces of said second device region, while said second dielectric layer protects said first device region; and
- forming embedded silicon-carbon regions in said second device region by a second selective epitaxy, wherein said embedded silicon-carbon regions are subsequently formed in said second source/drain trenches and said embedded silicon-carbon regions comprise C from about 0.5% to about 4.0% in atomic concentration.

* * * * *